US012615929B2

(12) United States Patent
Song et al.

(10) Patent No.: US 12,615,929 B2
(45) Date of Patent: Apr. 28, 2026

(54) DISPLAY DEVICE

(71) Applicant: LG Display Co., Ltd., Seoul (KR)

(72) Inventors: JiHun Song, Seoul (KR); Gyujae Yohn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 768 days.

(21) Appl. No.: 17/972,248

(22) Filed: Oct. 24, 2022

(65) Prior Publication Data

US 2023/0189587 A1 Jun. 15, 2023

(30) Foreign Application Priority Data

Dec. 10, 2021 (KR) ........................ 10-2021-0176888

(51) Int. Cl.
| | |
|---|---|
| *H10K 59/131* | (2023.01) |
| *H10D 86/40* | (2025.01) |
| *H10D 86/60* | (2025.01) |
| *H10K 59/121* | (2023.01) |
| *H10K 102/10* | (2023.01) |

(52) U.S. Cl.
CPC ......... *H10K 59/131* (2023.02); *H10D 86/423* (2025.01); *H10D 86/441* (2025.01); *H10D 86/481* (2025.01); *H10D 86/60* (2025.01); *H10K 59/1213* (2023.02); *H10K 59/1216* (2023.02); *H10K 2102/101* (2023.02)

(58) Field of Classification Search
CPC ............. H10K 59/131; H10K 59/1213; H10K 59/1216; H10K 2102/101; H10K 77/111;

H10K 59/126; H10K 71/80; H10K 2102/311; H10K 59/35; H10D 86/423; H10D 86/441; H10D 86/481; H10D 86/60; H10D 86/411; H10D 30/6758; H01L 21/6835; H01L 2221/6835
See application file for complete search history.

(56) References Cited

U.S. PATENT DOCUMENTS

| | | | | |
|---|---|---|---|---|
| 9,151,711 B2 * | 10/2015 | Cho | ..................... | H10F 71/139 |
| 9,612,498 B2 * | 4/2017 | Hara | .................. | H10D 30/6757 |
| 10,833,142 B2 * | 11/2020 | Shin | ..................... | H10D 86/60 |
| 10,909,921 B2 | 2/2021 | Hwang et al. | | |
| 11,335,260 B2 | 5/2022 | Hwang et al. | | |
| 11,917,870 B2 * | 2/2024 | Choi | ..................... | H10K 59/12 |
| 11,955,491 B2 * | 4/2024 | Miao | .................. | H10D 86/441 |
| 12,356,809 B2 * | 7/2025 | Zhang | .................. | H10K 59/353 |

(Continued)

FOREIGN PATENT DOCUMENTS

| | | |
|---|---|---|
| CN | 109524445 A | 3/2019 |
| CN | 115763487 A | 3/2023 |

(Continued)

*Primary Examiner* — Tan N Tran
(74) *Attorney, Agent, or Firm* — Seed Intellectual Property Law Group LLP

(57) ABSTRACT

According to an aspect of the present disclosure, a display device includes a substrate including a display area in which a plurality of sub-pixels are disposed, and a non-display area. The display device includes a plurality of signal lines extending from the display area to the non-display area and configured to transmit an alternating current voltage. The display device includes a semiconductor layer disposed between the substrate and the plurality of signal lines and overlapping the plurality of signal lines.

20 Claims, 21 Drawing Sheets

(56) References Cited

U.S. PATENT DOCUMENTS

| | | | |
|---|---|---|---|
| 2013/0163067 A1 | 6/2013 | Kim et al. | |
| 2014/0144501 A1* | 5/2014 | Jung | H01G 9/2036 |
| | | | 438/609 |
| 2017/0338293 A1 | 11/2017 | Guo | |
| 2021/0202643 A1 | 7/2021 | Lee et al. | |
| 2023/0073626 A1 | 3/2023 | Du et al. | |

FOREIGN PATENT DOCUMENTS

| | | |
|---|---|---|
| EP | 4145512 A1 | 3/2023 |
| JP | H02210849 A | 8/1990 |
| JP | H11220094 A | 8/1999 |
| KR | 10-1296263 B1 | 8/2013 |
| KR | 20180057775 A | 5/2018 |
| KR | 10-2020-0002050 A | 1/2020 |
| KR | 20210033683 A | 3/2021 |
| WO | WO 2021184275 A1 | 9/2021 |

* cited by examiner

SCL1

DEPLETION
AREA

1400

DISPLAY DEVICE

CROSS-REFERENCE TO RELATED APPLICATIONS

This application claims the priority of Korean Patent Application No. 10-2021-0176888 filed on Dec. 10, 2021, in the Korean Intellectual Property Office, the disclosure of which is incorporated herein by reference.

BACKGROUND

Technical Field

The present disclosure relates to a display device, and more particularly, to a display device that does not use a plastic substrate, thereby preventing the permeation of foreign, external materials such as moisture, oxygen, or the like, and reducing parasitic capacitance.

Description of the Related Art

As display devices used for a monitor of a computer, a TV set, a mobile phone, and the like, there are an organic light-emitting display (OLED) configured to autonomously emit, and a liquid crystal display (LCD) that requires a separate light source.

The range of application of the display devices is diversified from the monitor of the computer and the TV set to personal mobile devices, and studies are being conducted on the display devices having wide display areas and having reduced volumes and weights.

In addition, recently, a flexible display device, which is made by forming display elements, lines, and the like on a substrate made of a flexible plastic material having flexibility and thus may display images even by being folded or rolled up, has attracted attention as a next-generation display device.

BRIEF SUMMARY

One or more embodiments of the present disclosure provide a display device that uses a substrate configured as one of a transparent conductive oxide layer and an oxide semiconductor layer, instead of a plastic substrate.

One or more embodiments of the present disclosure provide a display device that reduces or minimizes penetration of moisture and oxygen.

One or more embodiments of the present disclosure provide a display device capable of simplifying the manufacturing process of the display device and reducing manufacturing costs by eliminating the steps associated with providing a plastic substrate.

One or more embodiments of the present disclosure provide a display device capable of reducing or minimizing a defect occurring during a laser lift off (LLO) process.

Further embodiments of the present disclosure provide a display device capable of reducing or minimizing noise by reducing parasitic capacitance applied to a gate drive circuit and a signal line for transmitting an alternating current voltage.

Technical benefits of the present disclosure are not limited to the above-mentioned benefits, and other benefits, which are not mentioned above, can be clearly understood by those skilled in the art from the following descriptions.

According to one embodiment of the present disclosure, a display device includes: a substrate including a display area in which a plurality of sub-pixels are disposed, and a non-display area; a plurality of signal lines extending from the display area to the non-display area and configured to transmit an alternating current voltage; and a semiconductor layer disposed between the substrate and the plurality of signal lines and overlapping the plurality of signal lines.

Other detailed matters of the example embodiments are included in the detailed description and the drawings.

According to the present disclosure, it is possible to easily control moisture permeability by using the transparent conductive oxide layer or the oxide semiconductor layer as the substrate of the display device.

According to the present disclosure, it is possible to improve flexibility of the display device by using the transparent conductive oxide thin-film layer or the oxide semiconductor thin-film layer as the substrate of the display device.

According to the present disclosure, the transparent conductive oxide thin-film layer or the oxide semiconductor thin-film layer is used as the substrate of the display device. Therefore, it is possible to reduce stress occurring when the display device is bent or rolled up, thereby reducing cracks in the display device.

According to the present disclosure, it is possible to simplify the structure of the display device and reduce the manufacturing costs by using the transparent conductive oxide layer or the oxide semiconductor layer as the substrate of the display device.

According to the present disclosure, it is possible to reduce static electricity occurring on the substrate and improve the display quality by using the transparent conductive oxide layer or the oxide semiconductor layer as the substrate of the display device.

According to the present disclosure, the substrate of the display device may be manufactured by the deposition process in the vacuum environment. Therefore, it is possible to shorten the substrate manufacturing time and reduce particles occurring on the substrate and defects caused by the particles.

According to the present disclosure, the semiconductor layer is disposed between the substrate of the display device and the signal line for transmitting the alternating current voltage. Therefore, it is possible to reduce or minimize the occurrence of parasitic capacitance between the substrate and the signal line for transmitting the alternating current voltage.

According to the present disclosure, it is possible to reduce or minimize the occurrence of parasitic capacitance between the substrate and the signal line.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
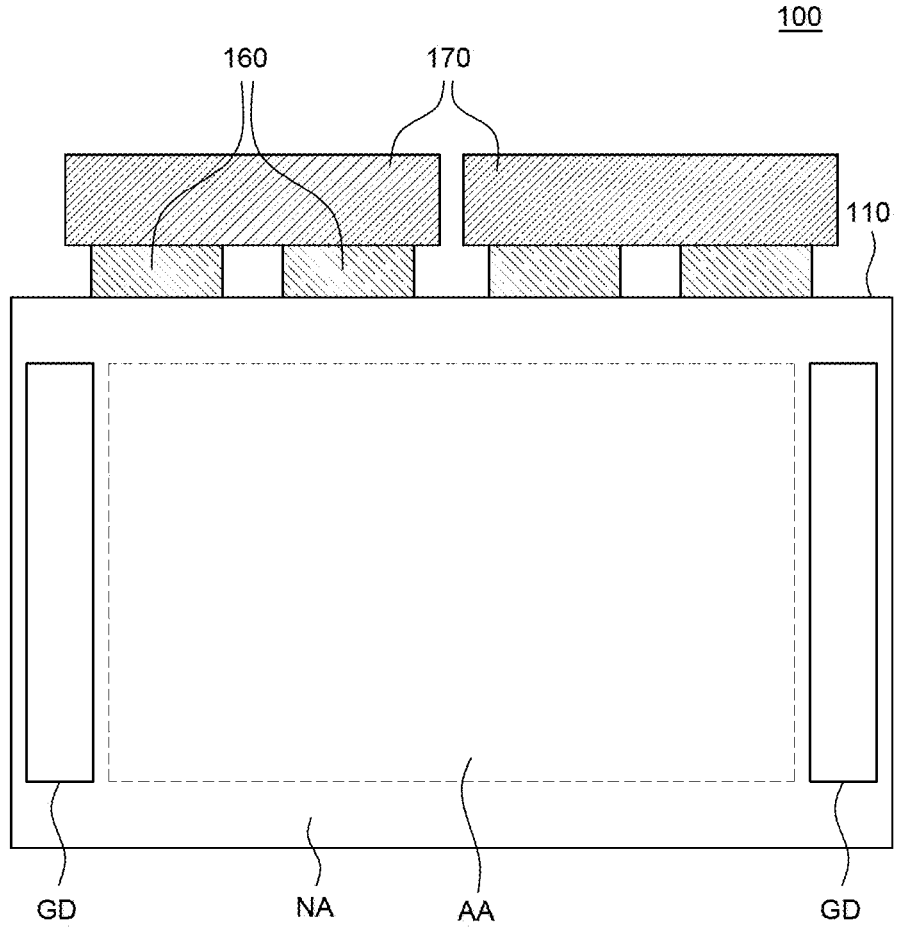
FIG. 1 is a top plan view of a display device according to an embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, dimensions (e.g., length, width, height, thickness, radius, diameter, area, etc.), ratios, angles, number of elements, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated, but it is to be noted that the relative dimensions including the relative size, location and thickness of the components illustrated in various drawings submitted herewith are part of the present disclosure.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

Figure 2:
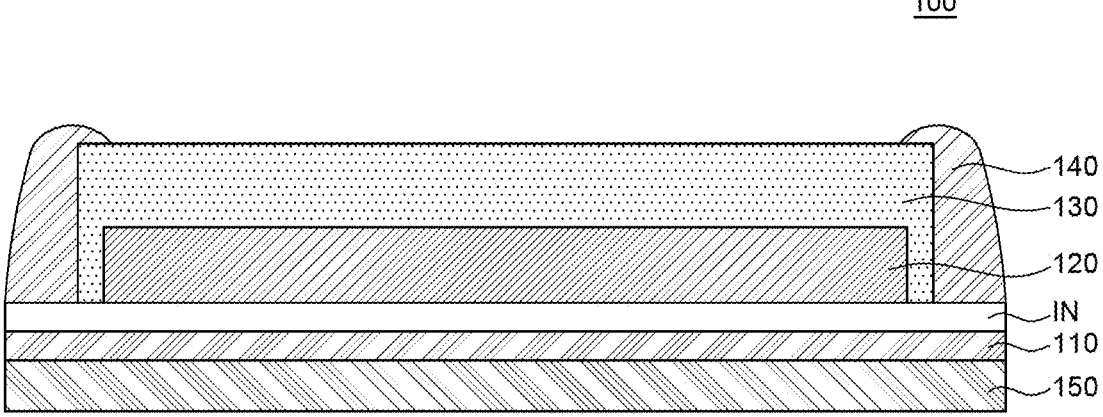
FIG. 2 is a schematic cross-sectional view of the display device according to the embodiment of the present disclosure.

FIG. 1 is a top plan view of a display device according to an embodiment of the present disclosure. FIG. 2 is a schematic cross-sectional view of the display device according to the embodiment of the present disclosure. For the convenience of description, FIG. 1 illustrates only a substrate 110, a plurality of flexible films 160, a plurality of printed circuit boards 170, and a gate drive circuit GD among various constituent elements of a display device 100.

Referring to FIGS. 1 and 2, the substrate 110 is a support member for supporting the other constituent elements of the display device 100. FIGS. 1 and 2 illustrate that the substrate 110 is configured as a single layer. However, the substrate 110 may be configured as a multilayer. The present disclosure is not limited thereto.

In one or more embodiments, the substrate 110 may be made of an oxide material. For instance, the substrate 110 may be made of any one of transparent conductive oxide and an oxide semiconductor.

For example, the substrate 110 may be made of transparent conductive oxide (TCO) such as indium tin oxide (ITO), indium zinc oxide (IZO), and indium-tin-zinc oxide (ITZO). In one embodiments, the substrate 110 is only made of one of the examples of a transparent conductive oxide (TCO).

In addition, the substrate 110 may be made of an oxide semiconductor material containing indium (In) and gallium (Ga), for example, a transparent oxide semiconductor such as indium-gallium-zinc oxide (IGZO), indium gallium oxide (IGO), and indium-tin-zinc oxide (ITZO). In one embodiments, the substrate 110 is only made of one of the examples of a transparent oxide semiconductor. However, the materials and types of transparent conductive oxide and oxide semiconductors are provided as examples. In another embodiment, the substrate 110 may be made of a combination of a transparent conductive oxide (TCO) and an oxide semiconductor material. The substrate 110 may be made of other transparent conductive oxide and oxide semiconductor materials that are not disclosed in the present specification. However, the present disclosure is not limited thereto.

Meanwhile, the substrate 110 may be formed by depositing the transparent conductive oxide or oxide semiconductor with a very small thickness. Therefore, the substrate 110 may have flexibility as the substrate 110 has a very small thickness compared to a conventional substrate such as glass or plastic (e.g., polyimide) substrate. In one embodiment, the substrate has about the same Further, the display device 100 including the substrate 110 having flexibility may be implemented as the flexible display device 100 that may display images even though the display device 100 is folded or rolled up. For example, in a case in which the display device 100 is a foldable display device, the substrate 110 may be folded or unfolded about a folding axis. As another example, in a case in which the display device 100 is a rollable display device, the display device may be rolled up around a roller and stored. Therefore, the display device 100 according to the embodiment of the present disclosure may be implemented as the flexible display device 100 such as a foldable display device or a rollable display device by using the substrate 110 having flexibility.

In addition, the display device 100 according to the embodiment of the present disclosure may perform a laser-lift-off (LLO) process by using the substrate 110 made of the transparent conductive oxide or oxide semiconductor. The LLO process means a process of separating a temporary substrate, which is disposed below the substrate 110, from the substrate 110 by using a laser during a process of manufacturing the display device 100. Therefore, the substrate 110 is a layer for further facilitating the LLO process, and thus the substrate 110 may be also be referred to as a functional thin-film, a functional thin-film layer, or a functional substrate. The LLO process will be described below in more detail.

The substrate 110 includes a display area AA and a non-display area NA.

The display area AA is a region in which images are displayed. To display the image, a pixel unit 120 including a plurality of sub-pixels may be disposed in the display area AA. For example, the pixel unit 120 may include the plurality of sub-pixels including light-emitting elements and drive circuits, thereby displaying the image.

The non-display area NA is a region in which no image is displayed. The non-display area NA is a region in which various lines, a drive circuit, and the like are disposed to operate the sub-pixels disposed in the display area AA. For example, various drive circuits such as the gate drive circuit GD and the data drive circuit may be disposed in the non-display area NA.

A gate drive circuit GD may be disposed in a gate-driver-in-panel (GIP) manner in the non-display area NA of the substrate 110. Therefore, the gate drive circuit GD disposed in the non-display area NA may adjust a light-emitting timing of the sub-pixel SP. The gate drive circuit GD, together with the display area AA, is disposed on the substrate 110, such that the display device 100 may be thin.

The gate drive circuit GD disposed in the GIP manner in the non-display area NA may be formed in the non-display area NA disposed at each of the left and right sides of the display area AA. However, the present disclosure is not limited thereto. Further, an area of the non-display area NA in which the gate drive circuit GD is disposed may be referred to as a GIP area.

The plurality of flexible films 160 is disposed at one end of the substrate 110. The plurality of flexible films 160 is electrically connected to one end of the substrate 110. Each of the plurality of flexible films 160 is a film having various types of components disposed on a base film having flexibility in order to supply signals to the plurality of sub-pixels in the display area AA. Each of the plurality of flexible films 160 may have one end disposed in the non-display area NA of the substrate 110 and supply data voltage or the like to the plurality of sub-pixels in the display area AA. Meanwhile, FIG. 1 illustrates four flexible films 160. However, the number of flexible films 160 may be variously changed in accordance with design. However, the present disclosure is not limited thereto.

Meanwhile, drive circuits such as gate drive circuits and data drive circuits may be disposed on the plurality of flexible films 160. The drive circuit is a component configured to process data for displaying the image and process a driving signal for processing the data. The drive circuit may be disposed in ways such as a chip-on-glass (COG) method, a chip-on-film (COF) method, and a tape carrier package (TCP) method depending on how the drive circuit is mounted. In the present specification, for the convenience of description, the configuration has been described in which the drive circuits are mounted on the plurality of flexible films 160 by the chip-on-film method. However, the present disclosure is not limited thereto.

The printed circuit boards 170 are connected to the plurality of flexible films 160. The printed circuit board 170 is a component for supplying a signal to the drive circuit. Various types of components for supplying the drive circuit with various driving signals such as driving signals, data voltages, and the like may be disposed on the printed circuit board 170. Meanwhile, FIG. 1 illustrates two printed circuit boards 170. However, the number of printed circuit boards 170 may be variously changed in accordance with design. The present disclosure is not limited thereto.

Referring to FIG. 2, an insulating layer IN is disposed on the substrate 110. The insulating layer IN may inhibit moisture or oxygen penetrating from the outside of the substrate 110 from being diffused. Moisture transmission properties of the display device 100 may be controlled by controlling a thickness or a layered structure of the insulating layer IN. In addition, the insulating layer IN inhibits the substrate 110 made of the transparent conductive oxide or oxide semiconductor from being short-circuited while coming into contact with other components such as the pixel unit 120. The insulating layer IN may be made of an inorganic material, for example, configured as a single layer or a multilayer made of silicon oxide (SiOx) or silicon nitride (SiNx). However, the present disclosure is not limited thereto. In one embodiment, the insulating layer IN may be disposed to fully overlap the pixel unit 120 as illustrated in FIG. 2.

The pixel unit 120 is disposed on the insulating layer IN. The pixel unit 120 may be disposed to correspond to the display area AA. The pixel unit 120 is comprised of a number of components and various layers that include transistors, conductors, semiconductors, insulators, light emitting materials and other materials and layers that have the circuits that make up the pixels, as well as the circuits to drive and control the pixels. The details of the pixel layer are not shown for ease of reference since its structure can be any of those well known in the art.

The pixel unit 120 includes the plurality of sub-pixels and is configured to display an image. The plurality of sub-pixels of the pixel unit 120 are minimum units constituting the display area AA. The light-emitting element and the drive circuit may be disposed in each of the plurality of sub-pixels. For example, the light-emitting element of each of the plurality of sub-pixels may be an organic light-emitting element including an anode, an organic light-emitting layer, and a cathode or be an LED including N-type semiconductor layer and P-type semiconductor layer and a light-emitting layer. However, the present disclosure is not limited thereto. Further, the drive circuit for operating the plurality of sub-pixels may include driving elements such as a thin-film transistor and a storage capacitor. However, the present disclosure is not limited thereto. Hereinafter, for the convenience of description, the assumption is made that the light-emitting element of each of the plurality of sub-pixels is the organic light-emitting element. However, the present disclosure is not limited thereto.

Meanwhile, the display device 100 may be a top-emission type display device or a bottom-emission type display device depending on a direction in which light is emitted from the light-emitting element.

The top-emission type display device allows the light emitted from the light-emitting element to propagate toward an upper side of the substrate 110 on which the light-emitting element is disposed. The top-emission type display device may have a reflective layer formed on a lower portion of the anode in order to allow the light emitted from the light-emitting element to propagate toward the upper side of the substrate 110, e.g., toward the cathode.

The bottom-emission type display device allows the light emitted from the light-emitting element to propagate toward a lower side of the substrate 110 on which the light-emitting element is disposed. In the case of the bottom-emission type display device, the anode may be made of only a transparent electrically conductive material and the cathode may be made of a metallic material with high reflectance in order to allow the light emitted from the light-emitting element to propagate toward the lower side of the substrate 110.

Hereinafter, for the convenience of description, the display device 100 according to the embodiment of the present disclosure will be described as being the bottom-emission type display device. However, the present disclosure is not limited thereto.

A sealing layer 130 is disposed to cover the pixel unit 120. The sealing layer 130 may seal the pixel unit 120 and protect the light-emitting element of the pixel unit 120 from foreign, external materials or forces such as outside moisture, oxygen, impact, and the like. The sealing layer 130 may be formed by alternately stacking a plurality of inorganic material layers and a plurality of organic material layers. For example, the inorganic material layer may be made of an inorganic material such as silicon nitride (SiNx), silicon oxide (SiOx), or aluminum oxide (AlOx). The organic material layer may be made of epoxy-based polymer or acrylic polymer. However, the present disclosure is not limited thereto. In addition, the sealing layer 130 may be configured as a face seal type sealing layer. For example, the sealing layer 130 may be formed by applying an ultraviolet-curable or thermosetting sealant onto the entire surface of the pixel unit 120. However, the sealing layer 130 may have various structures and be made of various materials. However, the present disclosure is not limited thereto.

In addition, a sealing substrate may be further disposed on the sealing layer 130. The sealing substrate may be made of a metallic material having a high modulus and high corrosion resistance. For example, the sealing substrate may be made of a material having a modulus as high as about 200 to 900 MPa. The sealing substrate may be made of a metallic material such as aluminum (Al), nickel (Ni), chromium (Cr), iron (Fe), and an alloy of nickel which is easily machined in the form of a foil or thin-film and has high corrosion resistance. Therefore, since the sealing substrate is made of a metallic material, the sealing substrate may be implemented in the form of an ultrathin-film and have protection characteristics strong against outside impact and scratches.

A seal member 140 is disposed to surround side surfaces of the pixel unit 120 and the sealing layer 130. The seal member 140 may be disposed in the non-display area NA and disposed to surround the pixel unit 120 disposed in the display area AA. The seal member 140 may be disposed to surround the side surface of the pixel unit 120 and the side surface of the sealing layer 130, thereby reducing or minimizing the penetration of foreign, external materials (e.g., moisture) into the pixel unit 120. For example, the seal member 140 may be disposed to cover a part of a top surface of the insulating layer IN that overlaps the non-display area NA protruding to the outside of the pixel unit 120. The seal member 140 may be disposed to cover a part of the side surface of the sealing layer 130 disposed to surround the pixel unit 120. The seal member 140 may be disposed to cover a part of a top surface of the sealing layer 130.

The seal member 140 may be made of an electrically non-conductive material having elasticity in order to seal the side surface of the pixel unit 120 and increase rigidity of the side surface of the display device 100. In addition, the seal member 140 may be made of a material having bondability. Further, the seal member 140 may further include a moisture absorbent to absorb moisture and oxygen from the outside and reduce or minimize the penetration of moisture through a lateral portion of the display device 100. For example, the seal member 140 may be made of a material such as polyimide (PI), polyurethane, epoxy, or acrylic. However, the present disclosure is not limited thereto.

A polarizing plate 150 is disposed below the substrate 110. The polarizing plate 150 may selectively transmit light and reduce the reflection of external light entering the substrate 110. Specifically, the display device 100 has various metallic materials formed on the substrate 110 and applied to a semiconductor element, a line, and a light-emitting element. Therefore, the external light entering the substrate 110 may be reflected by the metallic material. The reflection of external light may decrease visibility of the display device 100. In this case, the polarizing plate 150 for suppressing the reflection of external light may be disposed below the substrate 110, thereby improving outdoor visibility of the display device 100. However, the polarizing plate 150 may be removed in accordance with the implementation of the display device 100.

Meanwhile, although not illustrated in the drawings, a barrier film, together with the polarizing plate 150, may be disposed below the substrate 110. The barrier film may reduce or minimize the penetration of moisture and oxygen present outside the substrate 110 into the substrate 110, thereby protecting the pixel unit 120 including the light-emitting element. However, the barrier film may be removed in accordance with the implementation of the display device 100. However, the present disclosure is not limited thereto.

Hereinafter, the plurality of sub-pixels of the pixel unit 120 will be described in more detail with reference to FIGS. 3 to 5.

Figure 3:
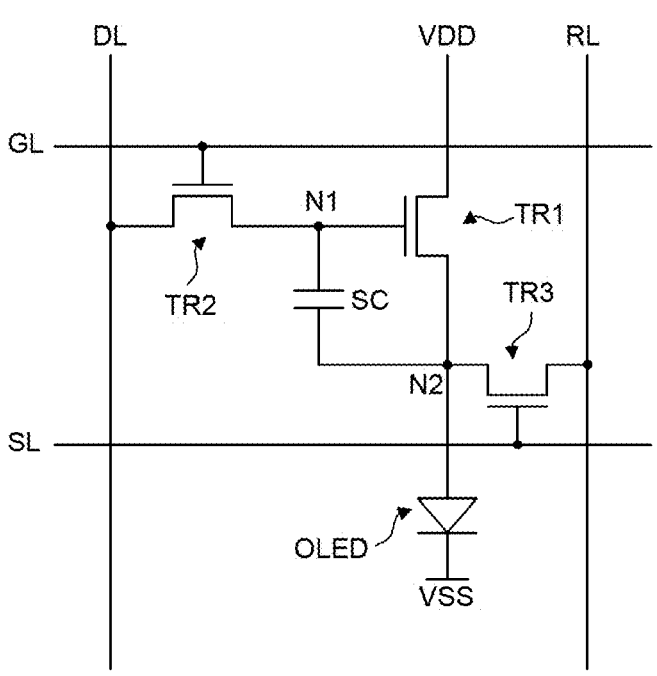
FIG. 3 is a circuit diagram of the sub-pixel of the display device according to the embodiment of the present disclosure.

FIG. 3 is a circuit diagram of the sub-pixel of the display device according to the embodiment of the present disclosure.

Referring to FIG. 3, the drive circuit for operating the light-emitting element OLED of each of the plurality of sub-pixels SP includes a first transistor TR1, a second transistor TR2, a third transistor TR3, and a storage capacitor SC. Further, a plurality of lines is disposed on the substrate 110 in order to operate the drive circuit and includes a gate line GL, a data line DL, a high-potential power line VDD, a sensing line SL, and a reference line RL.

The first transistor TR1, the second transistor TR2, and the third transistor TR3, which are included in the drive circuit of the single sub-pixel SP, each include a gate electrode, a source electrode, and a drain electrode.

Further, each of the first transistor TR1, the second transistor TR2, and the third transistor TR3 may be a P-type thin-film transistor or an N-type thin-film transistor. For example, in the P-type thin-film transistor, holes flow from the source electrode to the drain electrode, such that current may flow from the source electrode to the drain electrode. In the N-type thin-film transistor, electrons flow from the source electrode to the drain electrode, such that current may flow from the drain electrode to the source electrode. Hereinafter, the assumption is made that each of the first transistor TR1, the second transistor TR2, and the third transistor TR3 may be the N-type thin-film transistor in which current flows from the drain electrode to the source electrode. However, the present disclosure is not limited thereto.

The first transistor TR1 includes a first active layer, a first gate electrode, a first source electrode, and a first drain electrode. The first gate electrode is connected to a first node N1. The first source electrode is connected to the anode of the light-emitting element OLED. The first drain electrode is connected to the high-potential power line VDD. The first transistor TR1 may be turned on when a voltage of the first node N1 is higher than a threshold voltage. The first transistor TR1 may be turned off when the voltage of the first node N1 is lower than the threshold voltage. Further, when the first transistor TR1 is turned on, drive current may be transmitted to the light-emitting element OLED through the first transistor TR1. Therefore, the first transistor TR1 configured to control the drive current to be supplied to the light-emitting element OLED may be referred to as a driving transistor.

The second transistor TR2 includes a second active layer, a second gate electrode, a second source electrode, and a second drain electrode. The second gate electrode is connected to the gate line GL. The second source electrode is connected to the first node N1. The second drain electrode is connected to the data line DL. The second transistor TR2 may be turned on or off on the basis of a gate voltage from the gate line GL. When the second transistor TR2 is turned on, the first node N1 may be charged with the data voltage from the data line DL. Therefore, the second transistor TR2 configured to be turned on or off by the gate line GL may be referred to as a switching transistor.

The third transistor TR3 includes a third active layer, a third gate electrode, a third source electrode, and a third drain electrode. The third gate electrode is connected to the sensing line SL. The third source electrode is connected to a second node N2. The third drain electrode is connected to the reference line RL. The third transistor TR3 may be turned on or off on the basis of a sensing voltage from the sensing line SL. Further, when the third transistor TR3 is turned on, a reference voltage may be transmitted from the reference line RL to the second node N2 and the storage capacitor SC. Therefore, the third transistor TR3 may be referred to as a sensing transistor.

Meanwhile, FIG. 3 illustrates that the gate line GL and the sensing line SL are separate lines. However, the gate line GL and the sensing line SL may be implemented as a single line. However, the present disclosure is not limited thereto.

The storage capacitor SC is connected between the first gate electrode and the first source electrode of the first transistor TR1. That is, the storage capacitor SC may be connected between the first node N1 and the second node N2. The storage capacitor SC may supply a predetermined drive current to the light-emitting element OLED by maintaining a potential difference between the first gate electrode and the first source electrode of the first transistor TR1 while the light-emitting element OLED emits light. The storage capacitor SC includes a plurality of capacitor electrodes. For example, one of the plurality of capacitor electrodes may be connected to the first node N1, and another capacitor electrode may be connected to the second node N2.

The light-emitting element OLED includes the anode, the light-emitting layer, and the cathode. The anode of the light-emitting element OLED is connected to the second node N2, and the cathode is connected to a low-potential power line VSS. The light-emitting element OLED may emit light by receiving the drive current from the first transistor TR1.

Meanwhile, FIG. 3 illustrates that the drive circuit of the sub-pixel SP of the display device 100 according to the embodiment of the present disclosure has a 3T1C structure including the three transistors and the single storage capacitor SC. However, the number of transistors, the number of storage capacitors SC, and a connection relationship between the transistor and the storage capacitor may be variously changed in accordance with design. The present disclosure is not limited thereto.

Figure 4A:
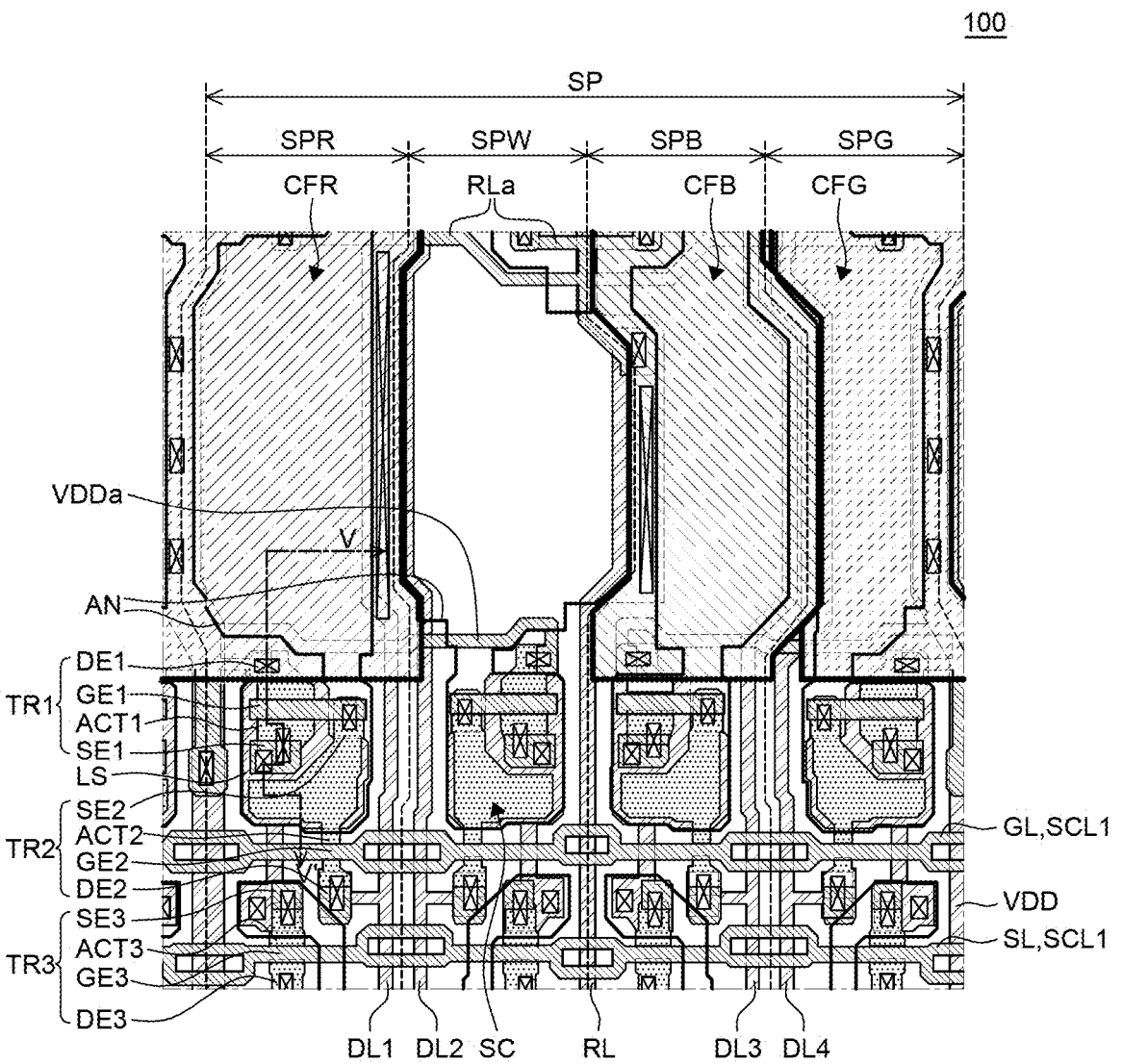
FIG. 4A is an enlarged top plan view of the display device according to the embodiment of the present disclosure.
Figure 4B:
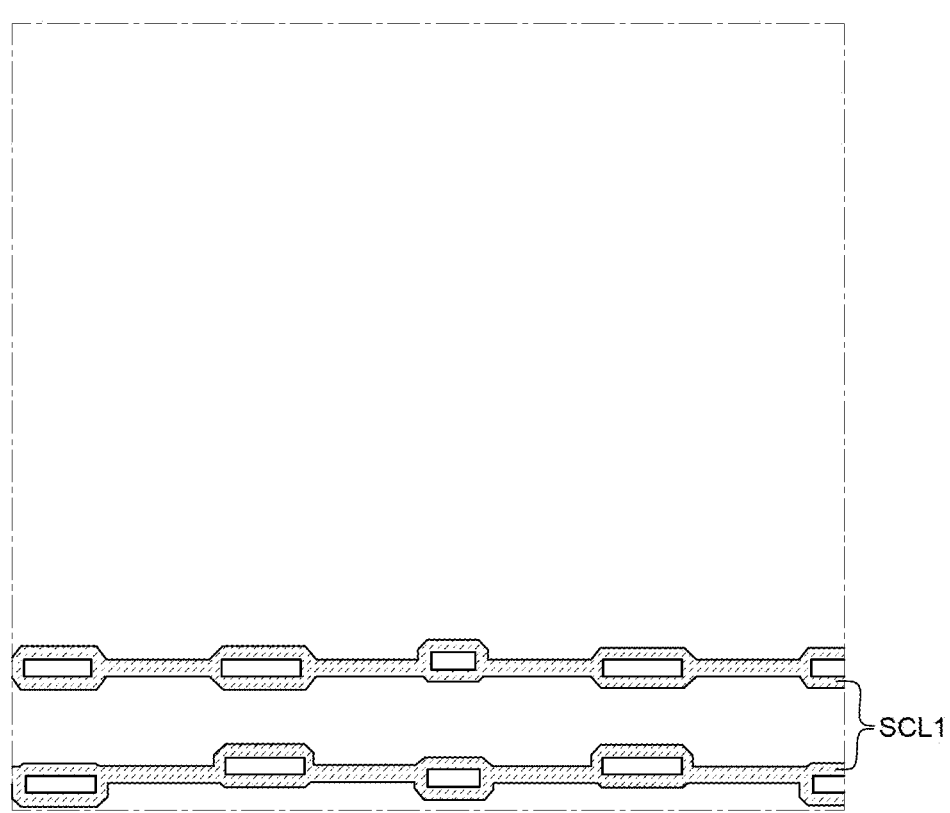
FIG. 4B is an enlarged top plan view of a semiconductor layer of the display device according to the embodiment of the present disclosure.

FIG. 4A is an enlarged top plan view of the display device according to the embodiment of the present disclosure. FIG. 4B is an enlarged top plan view of a semiconductor layer of the display device according to the embodiment of the present disclosure. FIG. 5 is a cross-sectional view taken along line V-V' in FIG. 4A. FIG. 4A is an enlarged top plan view of a red sub-pixel SPR, a white sub-pixel SPW, a blue sub-pixel SPB, and a green sub-pixel SPG that constitute the single pixel. For the convenience of description, a bank 115 (or a bank layer 115) is not illustrated in FIG. 4A. Referring to FIGS. 4A to 5, the display device 100 according to the embodiment of the present disclosure includes the substrate 110, the insulating layer IN, a buffer layer 111, a gate insulating layer 112, a passivation layer 113, a planarization layer 114, the bank 115, the first transistor TR1, the second transistor TR2, the third transistor TR3, the storage capacitor SC, the light-emitting element OLED, the gate line GL, the sensing line SL, the data line DL, the reference line RL, the high-potential power line VDD, a plurality of color filters CF, and a semiconductor layer SCL1.

Referring to FIG. 4A, the plurality of sub-pixels SP are disposed on the substrate 110.

The plurality of sub-pixels SP include the red sub-pixel SPR, the green sub-pixel SPG, the blue sub-pixel SPB, and the white sub-pixel SPW. For example, the red sub-pixel SPR, the white sub-pixel SPW, the blue sub-pixel SPB, and the green sub-pixel SPG may be sequentially disposed in a row direction. However, the arrangement order of the plurality of sub-pixels SP is not limited thereto.

Each of the plurality of sub-pixels SP include a light-emitting area and a circuit area. The light-emitting area is an area that may independently emit light with a single type of color. The light-emitting element OLED may be disposed in the light-emitting area. Specifically, the light-emitting area may be defined as an area exposed from the bank 115 (or in some cases, area between adjacent banks 115) and configured such that the light emitted from the light-emitting element OLED may propagate to the outside among the areas in which the plurality of color filters CF and the anode AN overlap one another. For example, referring to FIGS. 4A and 5 together, the light-emitting area LEA of the red sub-pixel SPR may be an area exposed from the bank 115 in an area in which a red color filter CFR and the anode AN overlap each other. The light-emitting area of the green sub-pixel SPG may be an area exposed from the bank 115 in an area in which a green color filter CFG and the anode AN overlap each other. The light-emitting area of the blue sub-pixel SPB may be a blue light-emitting area that emits blue light in an area exposed from the bank 115 in an area in which a blue color filter CF and the anode AN overlap each other. In this case, the light-emitting area of the white sub-pixel SPW in which no separate color filter CF is disposed may be a white light-emitting area that emits white light in an area that overlaps a part of the anode AN exposed from the bank 115.

The circuit area is an area except for the light-emitting area. A plurality of lines may be disposed in the circuit area and transmit various types of signals to a drive circuit DP and a drive circuit DP for operating the plurality of light-emitting elements OLED. Further, the circuit area in which the drive circuit DP, the plurality of lines, and the bank 115 are disposed may be a non-light-emitting area. For example, in the circuit area, there may be disposed the drive circuit DP including the first transistor TR1, the second transistor TR2, the third transistor TR3, and the storage capacitor SC, the plurality of signal lines including the plurality of high-potential power lines VDD, the plurality of data lines DL, the plurality of reference lines RL, the plurality of gate lines GL, and the sensing line SL, and the bank 115.

Figure 5:
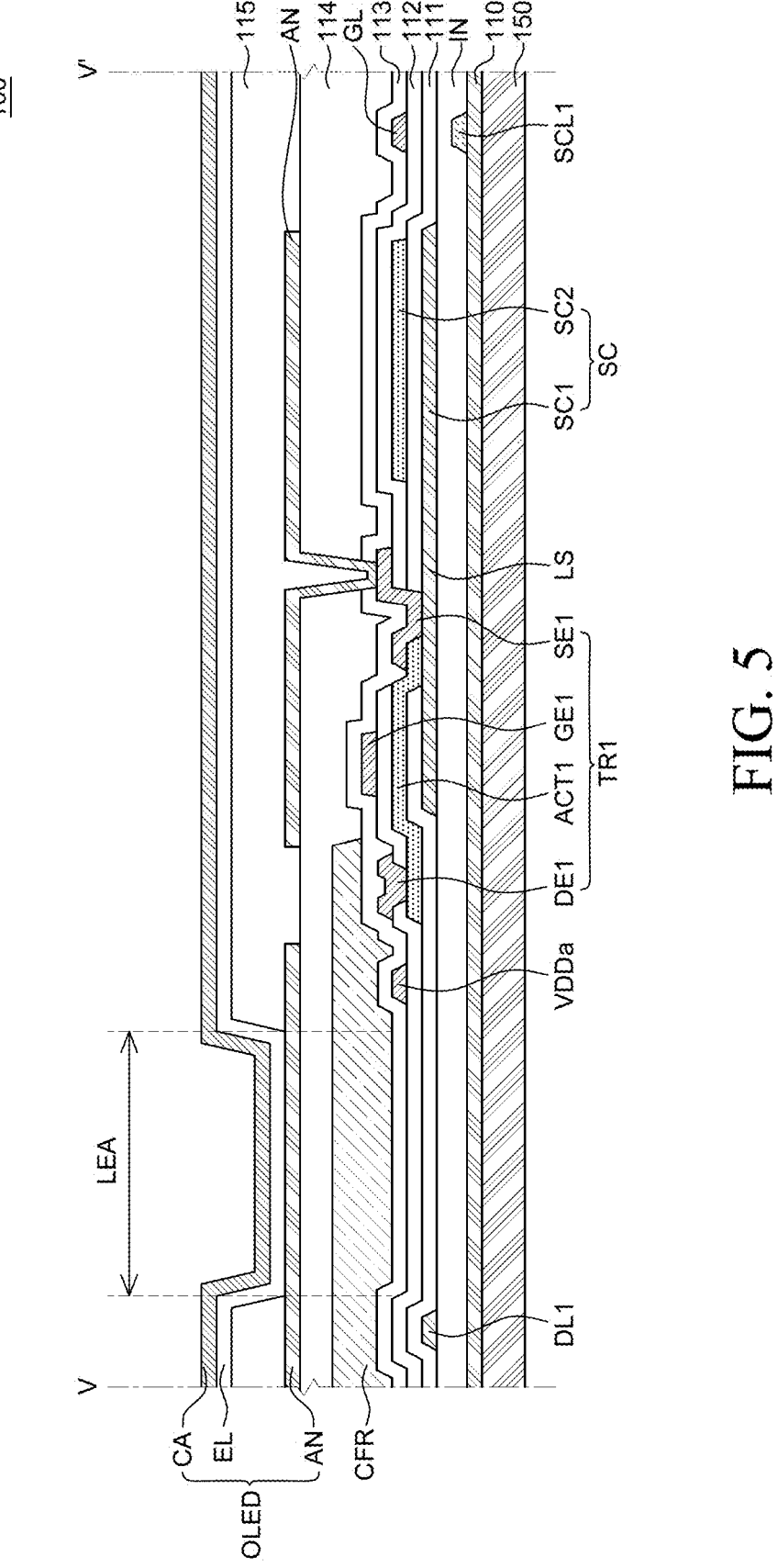
FIG. 5 is a cross-sectional view taken along line V-V' in FIG. 4A.

Referring to FIGS. 3 to 5 together, the semiconductor layer SCL1 and the insulating layer IN are disposed on the substrate 110. The plurality of signal lines and a light-blocking layer LS are disposed on the insulating layer IN.

The plurality of signal lines may be disposed on the insulating layer IN. The plurality of signal lines extends from the display area AA to the non-display area NA and transmit the alternating current voltage. The plurality of signal lines may include the plurality of high-potential power lines VDD, the plurality of gate lines GL, the plurality of data lines DL, and the plurality of reference lines RL. However, the present disclosure is not limited thereto. Various signal lines may be additionally used.

The plurality of high-potential power lines VDD, the plurality of data lines DL, the plurality of reference lines RL, and the light-blocking layer LS may be disposed on the same layer on the substrate 110 and made of the same electrically conductive material. For example, each of the plurality of high-potential power lines VDD, the plurality of data lines DL, the plurality of reference lines RL, and the light-blocking layer LS may be made of an electrically conductive material such as copper (Cu), aluminum (Al), molybdenum (Mo), nickel (Ni), titanium (Ti), chromium (Cr), or an alloy thereof. However, the present disclosure is not limited thereto.

The plurality of high-potential power lines VDD are lines for transmitting high power voltages to the plurality of sub-pixels SP. The plurality of high-potential power lines VDD may extend in the column direction between the plurality of sub-pixels SP. The two sub-pixels SP adjacent to each other in the row direction may share a single high-potential power line VDD among the plurality of high-potential power lines VDD. For example, one high-potential power line VDD may be disposed at the left side of the red sub-pixel SPR and supply the high-potential power voltage to the first transistor TR1 of each of the red sub-pixel SPR and the white sub-pixel SPW. The other high-potential power line VDD may be disposed at the right side of the green sub-pixel SPG and supply the high-potential power voltage to the first transistor TR1 of each of the blue sub-pixel SPB and the green sub-pixel SPG.

The plurality of data lines DL includes a first data line DL1, a second data line DL2, a third data line DL3 and a fourth data line DL4 which are lines that extend in the column direction between the plurality of sub-pixels SP and transmit the data voltages to the plurality of sub-pixels SP. The first data line DL1 may be disposed between the red sub-pixel SPR and the white sub-pixel SPW and transmit the data voltage to the second transistor TR2 of the red sub-pixel SPR. The second data line DL2 may be disposed between the first data line DL1 and the white sub-pixel SPW and transmit the data voltage to the second transistor TR2 of the white sub-pixel SPW. The third data line DL3 may be disposed between the blue sub-pixel SPB and the green sub-pixel SPG and transmit the data voltage to the second transistor TR2 of the blue sub-pixel SPB. The fourth data line DL4 may be disposed between the third data line DL3 and the green sub-pixel SPG and transmit the data voltage to the second transistor TR2 of the green sub-pixel SPG. In this case, the data line DL may be a signal line for transmitting the alternating current voltage. Therefore, a signal transmitted to the data line DL may have a swing shape. That is, a "swing shape" indicates the waveform of the alternating current voltage.

The plurality of reference lines RL are lines that extend in the column direction between the plurality of sub-pixels SP and transmit the reference voltage to the plurality of sub-pixels SP. The plurality of sub-pixels SP, which constitute a single pixel, may share the single reference line RL. For example, one reference line RL may be disposed between the white sub-pixel SPW and the blue sub-pixel SPB and transmit the reference voltage to the third transistor TR3 of each of the red sub-pixel SPR, the white sub-pixel SPW, the blue sub-pixel SPB, and the green sub-pixel SPG. In this case, the reference line RL may be a signal line for transmitting the alternating current voltage. Therefore, a signal transmitted to the reference line RL may have a swing shape.

Referring to FIGS. 4A to 5 together, the light-blocking layer LS is disposed on the insulating layer IN. The light-blocking layer LS may be disposed to overlap a first active layer ACT1 of at least the first transistor TR1 among the plurality of transistors TR1, TR2, and TR3 and inhibit the light from entering the first active layer ACT1. If the light is emitted to the first active layer ACT1, a leakage current occurs, which may degrade the reliability of the first transistor TR1 that is a driving transistor. In this case, when the light-blocking layer LS made of an opaque electrically conductive material such as copper (Cu), aluminum (Al), molybdenum (Mo), nickel (Ni), titanium (Ti), chromium (Cr), or an alloy thereof is disposed to overlap the first active layer ACT1, the light-blocking layer LS may inhibit the light from entering the first active layer ACT1 from the lower side of the substrate 110, thereby improving the reliability of the first transistor TR1. However, the present disclosure is not limited thereto. The light-blocking layer LS may be disposed to overlap a second active layer ACT2 of the second transistor TR2 and a third active layer ACT3 of the third transistor TR3.

Meanwhile, the drawings illustrate that the light-blocking layer LS is a single layer. However, the light-blocking layer LS may be formed as a plurality of layers. For example, the light-blocking layer LS may be provided as a plurality of layers disposed to overlap one another with at least any one of the insulating layer IN, the buffer layer 111, the gate insulating layer 112, and the passivation layer 113 interposed therebetween.

The buffer layer 111 is disposed on the plurality of high-potential power lines VDD, the plurality of data lines DL, the plurality of reference lines RL, and the light-blocking layer LS. The buffer layer 111 may suppress the penetration of moisture or impurities through the substrate 110. For example, the buffer layer 111 may be configured as a single layer or multilayer made of silicon oxide (SiOx) or silicon nitride (SiNx). However, the present disclosure is not limited thereto. In addition, the buffer layer 111 may be removed in accordance with the type of substrate 110 or the type of transistor, but the present specification is not limited thereto.

The first transistor TR1, the second transistor TR2, the third transistor TR3, and the storage capacitor SC are disposed on the buffer layer 111 of each of the plurality of sub-pixels SP.

First, the first transistor TR1 includes the first active layer ACT1, a first gate electrode GE1, a first source electrode SE1, and a first drain electrode DE1.

The first active layer ACT1 is disposed on the buffer layer 111. The first active layer ACT1 may be made of a semiconductor material such as an oxide semiconductor, amorphous silicon, or polysilicon, but the present disclosure is not limited thereto. For example, in the case in which the first active layer ACT1 is made of an oxide semiconductor, the first active layer ACT1 may include a channel area, a source area, and a drain area. The source area and the drain area may be areas having conductivity. However, the present disclosure is not limited thereto.

The gate insulating layer 112 is disposed on the first active layer ACT1. The gate insulating layer 112 may be a layer for insulating the first gate electrode GE1 and the first active layer ACT1 and made of an insulating material. For example, the gate insulating layer 112 may be configured as a single layer or multilayer made of silicon oxide (SiOx) or silicon nitride (SiNx), but the present disclosure is not limited thereto.

The first gate electrode GE1 is disposed on the gate insulating layer 112 so as to overlap the first active layer ACT1. The first gate electrode GE1 may be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

The first source electrode SE1 and the first drain electrode DE1 are disposed on the gate insulating layer 112 and spaced apart from each other. The first source electrode SE1 and the first drain electrode DE1 may be electrically connected to the first active layer ACT1 through a contact hole formed in the gate insulating layer 112. The first source electrode SE1 and the first drain electrode DE1 may be disposed on the same layer and made of the same electrically conductive material as the first gate electrode GE1. However, the present disclosure is not limited thereto. For example, the first source electrode SE1 and the first drain electrode DE1 may be made of copper (Cu), aluminum (Al), molybdenum (Mo), nickel (Ni), titanium (Ti), chromium (Cr), or an alloy thereof. However, the present disclosure is not limited thereto.

The first drain electrode DE1 is electrically connected to the high-potential power line VDD. For example, the first drain electrodes DE1 of the red sub-pixel SPR and the white sub-pixel SPW may be electrically connected to the high-potential power line VDD at the left side of the red sub-pixel SPR. The first drain electrodes DE1 of the blue sub-pixel SPB and the green sub-pixel SPG may be electrically connected to the high-potential power line VDD at the right side of the green sub-pixel SPG.

In this case, to electrically connect the first drain electrode DE1 to the high-potential power line VDD, an auxiliary high-potential power line VDDa may be further disposed. The auxiliary high-potential power line VDDa has one end electrically connected to the high-potential power line VDD, and the other end electrically connected to the first drain electrode DE1 of each of the plurality of sub-pixels SP. For example, in a case in which the auxiliary high-potential power line VDDa is disposed on the same layer and made of the same material as the first drain electrode DE1, one end of the auxiliary high-potential power line VDDa may be electrically connected to the high-potential power line VDD through the contact hole formed in the gate insulating layer 112 and the buffer layer 111, and the other end of the auxiliary high-potential power line VDDa may extend to the first drain electrode DE1 and be integrated with the first drain electrode DE1.

In this case, the first drain electrode DE1 of the red sub-pixel SPR and the first drain electrode DE1 of the white sub-pixel SPW, which are electrically connected to the same high-potential power line VDD, may be connected to the same auxiliary high-potential power line VDDa. The first drain electrode DE1 of the blue sub-pixel SPB and the first drain electrode DE1 of the green sub-pixel SPG may also be connected to the same auxiliary high-potential power line VDDa. However, the first drain electrode DE1 and the high-potential power line VDD may be electrically connected by means of other methods. However, the present disclosure is not limited thereto.

The first source electrode SE1 may be electrically connected to the light-blocking layer LS through the contact hole formed in the gate insulating layer 112 and the buffer layer 111. In addition, a part of the first active layer ACT1 connected to the first source electrode SE1 may be electrically connected to the light-blocking layer LS through the contact hole formed in the buffer layer 111. If the light-blocking layer LS floats, the threshold voltage of the first transistor TR1 is changed, which may affect the operation of the display device 100. Therefore, the light-blocking layer LS may be electrically connected to the first source electrode SE1, such that the voltage may be applied to the light-blocking layer LS, and the operation of the first transistor TR1 is not affected. In the present specification, the configuration has been described in which both the first active layer ACT1 and the first source electrode SE1 are in contact with the light-blocking layer LS. However, only any one of the first source electrode SE1 and the first active layer ACT1 may be in direct contact with the light-blocking layer LS. The present disclosure is not limited thereto.

Meanwhile, FIG. 5 illustrates that the gate insulating layer 112 is patterned to overlap only the first gate electrode GE1, the first source electrode SE1, and the first drain electrode DE1. However, the gate insulating layer 112 may be formed on the entire surface of the substrate 110. The present disclosure is not limited thereto.

The second transistor TR2 includes a second active layer ACT2, a second gate electrode GE2, a second source electrode SE2, and a second drain electrode DE2.

The second active layer ACT2 is disposed on the buffer layer 111. The second active layer ACT2 may be made of a semiconductor material such as an oxide semiconductor, amorphous silicon, or polysilicon, but the present disclosure is not limited thereto. For example, in the case in which the second active layer ACT2 is made of an oxide semiconductor, the second active layer ACT2 may include a channel area, a source area, and a drain area. The source area and the drain area may be areas having conductivity. However, the present disclosure is not limited thereto.

The second source electrode SE2 is disposed on the buffer layer 111. The second source electrode SE2 may be integrated with and electrically connected to the second active layer ACT2. For example, the second source electrode SE2 may be formed by forming a semiconductor material on the buffer layer 111 and making a part of the semiconductor material conductive. Therefore, a portion of the semiconductor material, which does not become conductive, may be the second active layer ACT2. A portion of the semiconductor material, which becomes conductive, may be the second source electrode SE2. However, the second active layer ACT2 and the second source electrode SE2 may be separately formed. However, the present disclosure is not limited thereto.

The second source electrode SE2 is electrically connected to the first gate electrode GE1 of the first transistor TR1. The first gate electrode GE1 may be electrically connected to the second source electrode SE2 through the contact hole formed in the gate insulating layer 112. Therefore, the first transistor TR1 may be turned on or off in response to a signal from the second transistor TR2.

The gate insulating layer 112 is disposed on the second active layer ACT2 and the second source electrode SE2. The second drain electrode DE2 and the second gate electrode GE2 are disposed on the gate insulating layer 112.

The second gate electrode GE2 is disposed on the gate insulating layer 112 so as to overlap the second active layer ACT2. The second gate electrode GE2 may be electrically connected to the gate line GL. The second transistor TR2 may be turned on or off on the basis of the gate voltage transmitted to the second gate electrode GE2. The second gate electrode GE2 may be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

Meanwhile, the second gate electrode GE2 may extend from the gate line GL. That is, the second gate electrode GE2 may be integrated with the gate line GL. The second gate electrode GE2 and the gate line GL may be made of the same electrically conductive material. For example, the gate line GL may be made of copper (Cu), aluminum (Al), molybdenum (Mo), nickel (Ni), titanium (Ti), chromium (Cr), or an alloy thereof. However, the present disclosure is not limited thereto.

The gate line GL is a line for transmitting the gate voltages to the plurality of sub-pixels SP. The gate line GL may extend in the row direction while traversing a circuit area CA of the plurality of sub-pixels SP. The gate line GL may extend in the row direction and cross the plurality of high-potential power lines VDD, the plurality of data lines DL, and the plurality of reference lines RL that extend in the column direction.

The second drain electrode DE2 is disposed on the gate insulating layer 112. The second drain electrode DE2 may be electrically connected to the second active layer ACT2 through the contact hole formed in the gate insulating layer 112. The second drain electrode DE2 may be electrically connected to one of the plurality of data lines DL through the contact hole formed in the gate insulating layer 112 and the buffer layer 111. For example, the second drain electrode DE2 of the red sub-pixel SPR may be electrically connected to the first data line DL1. The second drain electrode DE2 of the white sub-pixel SPW may be electrically connected to the second data line DL2. For example, the second drain electrode DE2 of the blue sub-pixel SPB may be electrically connected to the third data line DL3. The second drain electrode DE2 of the green sub-pixel SPG may be electrically connected to the fourth data line DL4. The second drain electrode DE2 may be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

The third transistor TR3 includes the third active layer ACT3, a third gate electrode GE3, a third source electrode SE3, and a third drain electrode DE3.

The third active layer ACT3 is disposed on the buffer layer 111. The third active layer ACT3 may be made of a semiconductor material such as an oxide semiconductor, amorphous silicon, or polysilicon, but the present disclosure is not limited thereto. For example, in the case in which the third active layer ACT3 is made of an oxide semiconductor, the third active layer ACT3 may include a channel area, a source area, and a drain area. The source area and the drain area may be areas having conductivity. However, the present disclosure is not limited thereto.

The gate insulating layer 112 is disposed on the third active layer ACT3. The third gate electrode GE3, the third source electrode SE3, and the third drain electrode DE3 are disposed on the gate insulating layer 112.

The third gate electrode GE3 is disposed on the gate insulating layer 112 so as to overlap the third active layer ACT3. The third gate electrode GE3 may be electrically connected to the sensing line SL. The third transistor TR3 may be turned on or off on the basis of the sensing voltage transmitted to the third transistor TR3. The third gate electrode GE3 may be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

Meanwhile, the third gate electrode GE3 may extend from the sensing line SL. That is, the third gate electrode GE3 may be integrated with the sensing line SL. The third gate electrode GE3 and the sensing line SL may be made of the same electrically conductive material. For example, the sensing line SL may be made of copper (Cu), aluminum (Al), molybdenum (Mo), nickel (Ni), titanium (Ti), chromium (Cr), or an alloy thereof. However, the present disclosure is not limited thereto.

The sensing line SL is a line that transmits the sensing voltages to the plurality of sub-pixels SP and extends in the row direction between the plurality of sub-pixels SP. For example, the sensing line SL may extend in the row direction at a boundary between the plurality of sub-pixels SP and cross the plurality of high-potential power lines VDD, the plurality of data lines DL, and the plurality of reference lines RL that extend in the column direction.

The third source electrode SE3 may be electrically connected to the third active layer ACT3 through the contact hole formed in the gate insulating layer 112. The third source electrode SE3 may be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

Meanwhile, a part of the third active layer ACT3, which is in contact with the third source electrode SE3, may be electrically connected to the light-blocking layer LS through the contact hole formed in the buffer layer 111. That is, the third source electrode SE3 may be electrically connected to the light-blocking layer LS with the third active layer ACT3 interposed therebetween. Therefore, the third source electrode SE3 and the first source electrode SE1 may be electrically connected to each other through the light-blocking layer LS.

The third drain electrode DE3 may be electrically connected to the third active layer ACT3 through the contact hole formed in the gate insulating layer 112. The third drain electrode DE3 may be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

The third drain electrode DE3 may be electrically connected to the reference line RL. For example, the third drain electrodes DE3 of the red sub-pixel SPR, the white sub-pixel SPW, the blue sub-pixel SPB, and the green sub-pixel SPG, which constitute the single pixel, may be electrically connected to the same reference line RL. That is, the plurality of sub-pixels SP, which constitutes a single pixel, may share the single reference line RL.

In this case, an auxiliary reference line RLa may be disposed to transmit signals to the plurality of sub-pixels SP disposed side by side in the row direction through the reference line RL extending in the column direction. The auxiliary reference line RLa may extend in the row direction and electrically connect the reference line RL to the third drain electrode DE3 of each of the plurality of sub-pixels SP. One end of the auxiliary reference line RLa may be electrically connected to the reference line RL through the contact hole formed in the buffer layer 111 and the gate insulating layer 112. Further, the other end of the auxiliary reference line RLa may be electrically connected to the third drain electrode DE3 of each of the plurality of sub-pixels SP. In this case, the auxiliary reference line RLa may be integrated with the third drain electrode DE3 of each of the plurality of sub-pixels SP. The reference voltage may be transmitted from the reference line RL to the third drain electrode DE3 through the auxiliary reference line RLa. However, the auxiliary reference line RLa may be formed separately from the third drain electrode DE3. However, the present disclosure is not limited thereto.

The storage capacitor SC is disposed in the circuit area CA of the plurality of sub-pixels SP. The storage capacitor SC may store a voltage between the first gate electrode GE1 and the first source electrode SE1 of the first transistor TR1 so that the light-emitting element OLED may continuously maintain the same state during a single frame. The storage capacitor SC includes a first capacitor electrode SC1, a second capacitor electrode SC2, and a third capacitor electrode SC3.

The first capacitor electrode SC1 is disposed between the insulating layer IN and the buffer layer 111 in each of the plurality of sub-pixels SP. The first capacitor electrode SC1 may be disposed to be closest to the substrate 110 among the conductive constituent elements disposed on the substrate 110. The first capacitor electrode SC1 may be made of the same material as the light-blocking layer LS or integrated with the light-blocking layer LS. The first capacitor electrode SC1 may be electrically connected to the first source electrode SE1 through the light-blocking layer LS.

The buffer layer 111 is disposed on the first capacitor electrode SC1. The second capacitor electrode SC2 is disposed on the buffer layer 111. The second capacitor electrode SC2 may be disposed to overlap the first capacitor electrode SC1. The second capacitor electrode SC2 may be integrated with the second source electrode SE2 and electrically connected to the second source electrode SE2 or the first gate electrode GE1. For example, the second source electrode SE2 and the second capacitor electrode SC2 may be formed by forming a semiconductor material on the buffer layer 111 and making a part of the semiconductor material conductive. Therefore, a portion of the semiconductor material, which does not become conductive, may serve as the second active layer ACT2. A portion of the semiconductor material, which becomes conductive, may serve as the second source electrode SE2 or the second capacitor electrode SC2. Further, as described above, the first gate electrode GE1 is electrically connected to the second source electrode SE2 through the contact hole formed in the gate insulating layer 112. Therefore, the second capacitor electrode SC2 may be integrated with the second source electrode SE2 and electrically connected to the second source electrode SE2 and the first gate electrode GE1.

The passivation layer 113 is disposed on the second capacitor electrode SC2. The third capacitor electrode SC3 is disposed on the passivation layer 113. The third capacitor electrode SC3 may be disposed to overlap the first capacitor electrode SC1 and the second capacitor electrode SC2. The third capacitor electrode SC3 may be integrated with the anode AN and electrically connected to the first source electrode SE1.

In summary, the first capacitor electrode SC1 of the storage capacitor SC may be integrated with the light-blocking layer LS and electrically connected to the light-blocking layer LS, the first source electrode SE1, and the third source electrode SE3. Further, the second capacitor electrode SC2 may be integrated with the second source electrode SE2 or the second active layer ACT2 and electrically connected to the second source electrode SE2 and the first gate electrode GE1. In addition, the third capacitor electrode SC3 may be integrated with the anode AN and electrically connected to the first source electrode SE1 and the third source electrode SE3. Therefore, the first and second capacitor electrodes SC1 and SC2, which overlap each other with the buffer layer 111 interposed therebetween, and the second and third capacitor electrodes SC2 and SC3, which overlap each other with the passivation layer 113 interposed therebetween, may maintain the light-emitting element OLED in the constant state by constantly maintaining the voltages of the first gate electrode GE1 and the first source electrode SE1 of the first transistor TR1 while the light-emitting element OLED emits light.

The passivation layer 113 is disposed on the first transistor TR1, the second transistor TR2, the third transistor TR3, and the storage capacitor SC. The passivation layer 113 is an insulating layer for protecting the components disposed below the passivation layer 113. For example, the passivation layer 113 may be configured as a single layer or multilayer made of silicon oxide (SiOx) or silicon nitride (SiNx). However, the present disclosure is not limited thereto. In addition, the passivation layer 113 may be removed in accordance with the embodiments.

The plurality of color filters CF is disposed in the light-emitting area EA of each of the plurality of sub-pixels SP and disposed on the passivation layer 113. As described above, the display device 100 according to the embodiment of the present disclosure is the bottom-emission type display device that allows the light emitted from the light-emitting element OLED to propagate to the lower sides of the light-emitting element OLED and the substrate 110. Therefore, the plurality of color filters CF may be disposed below the light-emitting element OLED. The light emitted from the light-emitting element OLED may be implemented in the form of light beams with various colors by passing through the plurality of color filters CF.

The plurality of color filters CF includes the red color filter CFR, a blue color filter CFB, and the green color filter CFG. The red color filter CFR may be disposed in the light-emitting area EA of the red sub-pixel SPR among the plurality of sub-pixels SP. The blue color filter CFB may be disposed in the light-emitting area EA of the blue sub-pixel SPB. The green color filter CFG may be disposed in the light-emitting area EA of the green sub-pixel SPG.

The planarization layer 114 is disposed on the passivation layer 113 and the plurality of color filters CF. The planarization layer 114 is an insulating layer for flattening an upper portion of the substrate 110 on which the first transistor TR1, the second transistor TR2, the third transistor TR3, the storage capacitor SC, the plurality of high-potential power lines VDD, the plurality of data lines DL, the plurality of reference lines RL, the plurality of gate lines GL, and the plurality of sensing lines SL are disposed. The planarization layer 114 may be configured as a single layer or multilayer made of an organic material, for example, polyimide or photo acrylic. However, the present disclosure is not limited thereto.

The light-emitting element OLED is disposed in the light-emitting area EA of each of the plurality of sub-pixels SP. The light-emitting element OLED is disposed on the planarization layer 114 of each of the plurality of sub-pixels SP. The light-emitting element OLED includes the anode AN, a light-emitting layer EL, and a cathode CA.

The anode AN is disposed on the planarization layer 114 in the light-emitting area EA. Because the anode AN supplies holes to the light-emitting layer EL, the anode AN may be made of an electrically conductive material having a high work function and may also be called an anode AN. For example, the anode AN may be made of a transparent electrically conductive material such as indium tin oxide (ITO) or indium zinc oxide (IZO), but the present disclosure is not limited thereto.

Meanwhile, the anode AN may extend toward the circuit area. A part of the anode AN may extend from the light-emitting area EA toward the first source electrode SE1 of the circuit area CA and be electrically connected to the first source electrode SE1 through the contact hole formed in the planarization layer 114 and the passivation layer 113. Therefore, the anode AN of the light-emitting element OLED may extend to the circuit area CA and be electrically connected to the first source electrode SE1 of the first transistor TR1 or the second capacitor electrode SC2 of the storage capacitor SC.

The light-emitting layer EL is disposed on the anode AN in the light-emitting area and the circuit area. The light-emitting layer EL may be configured as a single layer over the plurality of sub-pixels SP. That is, the light-emitting layers EL of the plurality of sub-pixels SP may be connected to and integrated with one another. The light-emitting layer EL may be configured as a single light-emitting layer. The light-emitting layer EL may have a structure in which a plurality of light-emitting layers configured to emit light beams with different colors is stacked. The light-emitting layer EL may further include organic layers such as a hole injection layer, a hole transport layer, an electron transport layer, and an electron injection layer.

The cathode CA is disposed on the light-emitting layer EL in the light-emitting area and circuit area. Because the cathode CA supplies electrons to the light-emitting layer EL, the cathode CA may be made of an electrically conductive material having a low work function. The cathode CA may be configured as a single layer over the plurality of sub-pixels SP. That is, the cathodes CA of the plurality of sub-pixels SP may be connected to and integrated with one another. For example, the cathode CA may be made of an electrically transparent conductive material such as indium tin oxide (ITO) or indium zinc oxide (IZO) or made of an alloy of ytterbium (Yb). The cathode CA may further include a metal doping layer, but the present specification is not limited thereto. Meanwhile, although not illustrated in FIGS. 4A to 5, the cathode CA of the light-emitting element OLED may be electrically connected to the low-potential power line VSS and receive the low-potential power voltage.

The bank 115 is disposed between the anode AN and the light-emitting layer EL. The bank 115 is disposed to overlap the display area AA and cover an edge of the anode AN. The bank 115 may be disposed at a boundary between the adjacent sub-pixels SP and reduce mixing of colors of the light beams emitted from the light-emitting element OLED of each of the plurality of sub-pixels SP. The bank 115 may be made of an insulating material. For example, the bank 115 may be made of polyimide-based resin, acryl-based resin, or benzocyclobutene (BCB)-based resin. However, the present disclosure is not limited thereto.

Meanwhile, the semiconductor layer SCL1 may be disposed on the substrate 110. Referring to FIG. 4A, the semiconductor layer SCL1 may be disposed between the substrate 110 and the insulating layer IN. In addition, referring to FIGS. 4A and 4B, the semiconductor layer SCL1 may overlap the gate line GL and the sensing line SL. That is, the semiconductor layer SCL1 may be disposed to overlap the gate line GL and the sensing line SL that are the signal lines extending from the gate drive circuit GD to the display area AA.

In addition, although not illustrated in the drawings, the semiconductor layer SCL1 may also be disposed in the non-display area NA. For example, the gate drive circuit GD may include a line disposed on the same layer as the gate line GL and the semiconductor layer SCL1 may be disposed to overlap the line.

The semiconductor layer SCL1 may be made of a semiconductor material. For example, the semiconductor layer SCL1 may be made of any one of an oxide semiconductor, amorphous silicon, and polysilicon. In addition, the semiconductor layer SCL1 may be an N-type semiconductor layer or a P-type semiconductor layer.

The substrate 110 of the display device 100 according to the embodiment of the present disclosure is made of any one of the transparent conductive oxide and the oxide semiconductor. Therefore, the display device 100 may decrease in thickness. In the related art, a plastic or glass substrate is mainly used as the substrate of the display device. However, it is hard to form the plastic or glass substrate to have a thin thickness at a predetermined level or less. In contrast, the transparent conductive oxide and the oxide semiconductor may allow the display device to have a relatively smaller thickness through a deposition process such as sputtering. Therefore, in the display device 100 according to the embodiment of the present disclosure, the substrate 110 for supporting several components of the display device 100 is made of the transparent conductive oxide layer or oxide semiconductor layer. Therefore, it is possible to reduce a thickness of the display device 100 and implement a slim design of the display device 100.

In addition, in the display device 100 according to the embodiment of the present disclosure, the substrate 110 is made of the transparent conductive oxide or oxide semiconductor, such that it is possible to improve the flexibility of the display device 100 or reduce stress caused by the deformation of the display device 100. Specifically, when the substrate 110 is made of the transparent conductive oxide layer or oxide semiconductor, the substrate 110 may be formed to have a relatively thin film compared to those substrates that are not made of, for example, transparent conductive oxide layer or oxide semiconductor. In this case, the substrate 110 may be referred to as a first transparent thin-film layer. Therefore, the display device 100 including the substrate 110 may have high flexibility. Therefore, the display device 100 may be easily curved or rolled up. Therefore, in the display device 100 according to the embodiment of the present disclosure, the substrate 110 is made of any one of the transparent conductive oxide layer and the oxide semiconductor layer, such that it is possible to improve flexibility of the display device 100 and reduce stress caused by the deformation of the display device 100. Therefore, it is possible to reduce or minimize cracks formed in the display device 100.

In addition, in the display device 100 according to the embodiment of the present disclosure, the substrate 110 may be made of any one of the transparent conductive oxide layer and the oxide semiconductor layer, thereby reducing the likelihood that the static electricity occurs on the substrate 110. If the substrate 110 is made of plastic and the static electricity occurs, various types of lines and driving elements on the substrate 110 may be damaged by the static electricity, or the static electricity may affect the operations of the lines and components, which may deteriorate the display quality. Instead, if the substrate 110 is made of the transparent conductive oxide layer or oxide semiconductor layer, it is possible to reduce or minimize the static electricity occurring on the substrate 110 and simplify the configuration for blocking and discharging the static electricity. Therefore, in the display device 100 according to the embodiment of the present disclosure, the substrate 110 is made of any one of the transparent conductive oxide layer or oxide semiconductor layer that is low in the likelihood of the occurrence of the static electricity. Therefore, it is possible to reduce or minimize damage or deterioration in display quality caused by the static electricity.

In addition, in the display device 100 according to the embodiment of the present disclosure, the substrate 110 is made of one of the transparent conductive oxide and the oxide semiconductor. Therefore, it is possible to reduce or minimize the penetration of outside moisture or oxygen into the display device 100 through the substrate 110. When the substrate 110 is made of the transparent conductive oxide layer or oxide semiconductor layer, the substrate 110 is formed in a vacuum environment, such that the likelihood of the occurrence of particles is low. In addition, even if the particles exist, the sizes of the particles are small in size compared to the case when the substrate 110 is not formed in a vacuum environment. Therefore, it is possible to reduce or minimize the penetration of moisture and oxygen into the display device 100. Therefore, in the display device 100 according to the embodiment of the present disclosure, the substrate 110 is made of the transparent conductive oxide or oxide semiconductor that decreases the likelihood of the occurrence of particles and is effective in preventing permeation of any foreign, external materials such as moisture, oxygen, or the like. Therefore, it is possible to improve reliability of the display device 100 and the light-emitting element OLED including the organic layer.

In addition, in the display device 100 according to the embodiment of the present disclosure, the substrate 110 is made of any one of the transparent conductive oxide and the oxide semiconductor, or in some embodiments, a combination thereof. Further, according to some embodiments, the substrate 110 may be used in conjunction with a thin, inexpensive barrier film which is attached to a lower portion of the substrate 110. According to a display device of a related art, a substrate is made of a material, for example, a plastic material having low moisture transmission preventing performance, and the moisture transmission performance may be improved by attaching a thick, expensive barrier film having high moisture transmission preventing performance. However, in the display device 100 according to the embodiment of the present disclosure, the substrate 110 is made of the transparent conductive oxide or oxide semiconductor that is effective in preventing moisture permeation. Therefore, a thin, inexpensive barrier film may be attached to the lower portion of the substrate 110 as an optional design. Therefore, in the display device 100 according to the embodiment of the present disclosure, the substrate 110 is made of any one of the transparent conductive oxide and the oxide semiconductor that are in effective in preventing penetration of foreign, external materials (e.g., moisture). Therefore, it is possible to reduce manufacturing costs for the display device.

In addition, in the display device 100 according to the embodiment of the present disclosure, the substrate 110 is made of any one of the transparent conductive oxide and the oxide semiconductor. Therefore, it is possible to apply a laser-lift-off (LLO) process. During the process of manufacturing the display device 100, the pixel unit 120 may be formed on the substrate 110 by attaching a temporary substrate having a sacrificial layer to a lower portion of the substrate 110. The sacrificial layer may be made of, for example, hydrogenated amorphous silicon or amorphous silicon hydrogenated and doped with impurities. Further, when laser beams are emitted to the lower portion of the temporary substrate after the display device 100 is completely manufactured, the sacrificial layer may be dehydrogenated, and the sacrificial layer and the temporary substrate may be separated from the substrate 110. In this case, the transparent conductive oxide and the oxide semiconductor are the materials that may be subjected to the LLO process together with the sacrificial layer and the temporary substrate. Therefore, even though the substrate 110 is made of any one of the transparent conductive oxide and the oxide semiconductor, the substrate 110 and the temporary substrate may be easily separated. Therefore, in the display device 100 according to the embodiment of the present disclosure, the substrate 110 made of any one of the transparent conductive oxide layer and the oxide semiconductor that may be subjected to the LLO process. Therefore, it is possible to easily manufacture the display device 100 even by using a manufacturing process and manufacturing apparatus in the related art. In other words, by having the substrate 110 made of any one of the transparent conductive oxide and the oxide semiconductor, it is possible to incorporate this into the existing manufacturing process used in the art using existing manufacturing tools and equipment.

In addition, in the display device 100 according to the embodiment of the present disclosure, the semiconductor layer is disposed between the substrate and the signal line. Therefore, it is possible to reduce parasitic capacitance occurring in the signal line for transmitting the alternating current voltage.

Hereinafter, the principle of the effect and improvement obtained by the semiconductor layer SCL1 disposed in the display device 100 according to the embodiment of the present disclosure will be described in detail with reference to FIGS. 6A to 7.

Figure 6A:
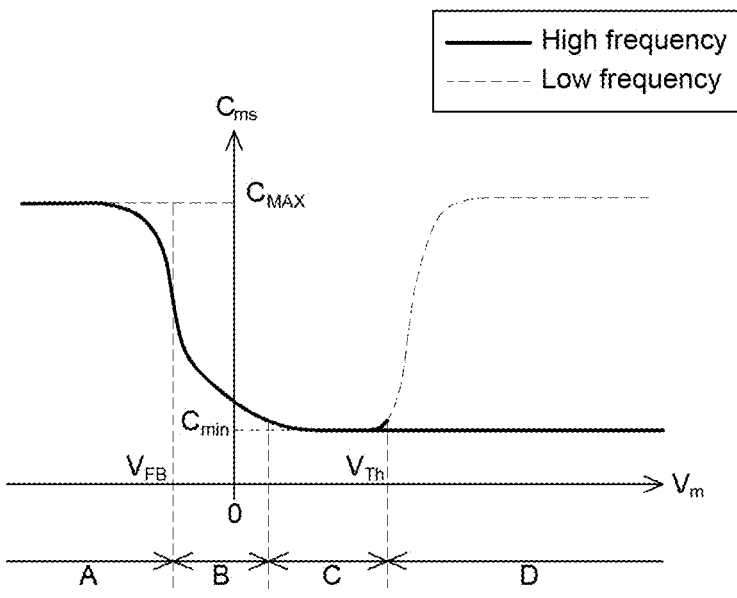
FIG. 6A is a graph illustrating capacitance between a signal line and the semiconductor layer of the display device according to the embodiment of the present disclosure.
Figure 6B:
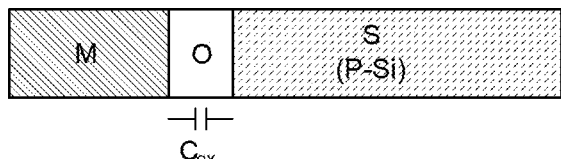
FIGS. 6B to 6E are schematic views for explaining capacitance between the signal line and the semiconductor layer of the display device according to the embodiment of the present disclosure.
Figure 6C:
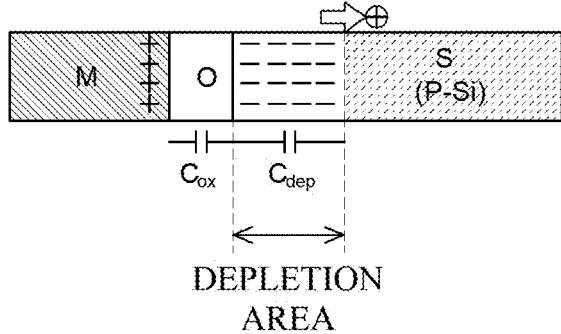
Figure 6D:
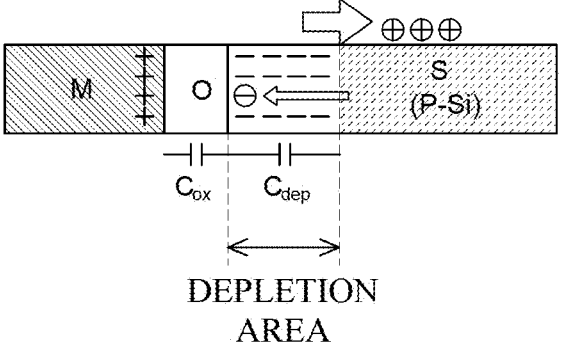
Figure 6E:
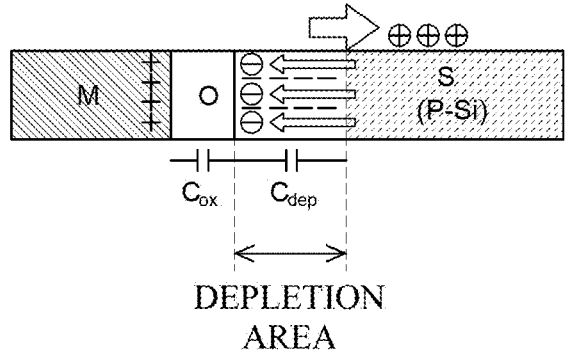
Figure 7:
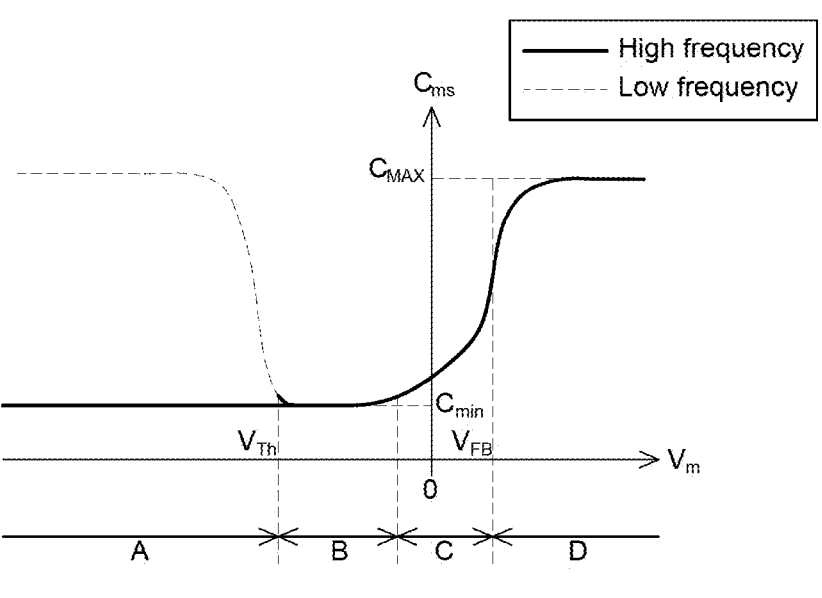
FIG. 7 is a graph illustrating capacitance between the signal line and the semiconductor layer of the display device according to the embodiment of the present disclosure.

FIG. 6A is a graph illustrating capacitance between the signal line and the semiconductor layer of the display device according to the embodiment of the present disclosure. FIGS. 6B to 6E are schematic views for explaining capacitance between the signal line and the semiconductor layer of the display device according to the embodiment of the present disclosure. FIG. 7 is a graph illustrating capacitance between the signal line and the semiconductor layer of the display device according to the embodiment of the present disclosure. FIG. 6A is a graph in the case of the P-type semiconductor layer SCL1, and FIG. 7 is a graph in the case of the N-type semiconductor layer SCL1. FIGS. 6B to 6E schematically illustrate that a metal layer M corresponds to the signal line in the display device 100, a semiconductor layer S corresponds to the semiconductor layer SCL1, and an oxide layer O corresponds to the insulating layer IN disposed between the signal line and the semiconductor layer SCL1. In this case, in FIGS. 6A and 7, an X-axis indicates a voltage ($V_m$) applied to the metal layer M, and a Y-axis indicates capacitance ($C_{ms}$) between the metal layer M and the semiconductor layer S.

First, the case in which the semiconductor layer S is the P-type semiconductor layer will be described with reference to FIGS. 6A to 6E. As a magnitude of the voltage ($V_m$) applied to the metal layer M, which is the signal line, increases, an accumulation state, a depletion state, a weak inversion state, and a strong inversion state are sequentially made. In FIG. 6A, A indicates the accumulation state, B indicates the depletion state, C indicates the weak inversion state, and D indicates the strong inversion state.

First, the accumulation state is a state in which the magnitude ($V_m$) of the voltage applied to the metal layer M is smaller than that of a flat band voltage ($V_{FB}$). In this case, the capacitance ($C_{ms}$) between metal layer M and the semiconductor layer SCL1 may be equal to capacitance ($C_{ox}$) on the oxide layer O and have a maximum value ($C_{max}$).

Next, the depletion and weak inversion states are states in which the magnitude of the voltage ($V_m$) applied to the metal layer M is larger than that of the flat band voltage ($V_{FB}$) and smaller than that of a threshold voltage ($V_{TH}$). In this case, the weak inversion state is a state in which the magnitude of the voltage ($V_m$) applied to the metal layer M is close to that of the threshold voltage ($V_{TH}$), e.g., a state in which capacitance ($C_{ms}$) between the metal layer M and the semiconductor layer S has a minimum value ($C_{min}$). The depletion state may be a state that excludes the weak inversion state.

In the depletion state, a depletion area may be formed in an area of the semiconductor layer S adjacent to the oxide layer O. In the case of the P-type semiconductor layer S, a majority carrier is a hole, and a minority carrier is an electron. When a voltage equal to or higher than the flat band voltage ($V_{FB}$) is applied to the metal layer M, the holes in the semiconductor layer S adjacent to the oxide layer O are pushed to an area distant from the oxide layer O, such that the depletion area may be formed in the area of the semiconductor layer S adjacent to the oxide layer O. The depletion area is an area in which the holes are pushed, and only the electrons, e.g., the space charges remain. Therefore, capacitance ($C_{dep}$) corresponding to the depletion area is additionally generated, and the capacitance ($C_{ms}$) between the metal layer M and the semiconductor layer S becomes a value in which the capacitance ($C_{ox}$) on the oxide layer O and the capacitance ($C_{dep}$) corresponding to the depletion area are connected in series. Therefore, the capacitance ($C_{ms}$) between the metal layer M and the semiconductor layer S in the depletion state becomes lower than the capacitance ($C_{ms}$) between the metal layer M and the semiconductor layer S in the accumulation state.

In the weak inversion state, the electrons in the semiconductor layer S begin to move to an area adjacent to the interface with the oxide layer O, e.g., to the depletion area as the voltage applied to the metal layer M increases. As the electrons move as described above, the space charges in the depletion area are very small in number than the space charges in the depletion state. Therefore, even in the weak inversion state, the capacitance ($C_{ms}$) between the metal layer M and the semiconductor layer S becomes the value in which the capacitance ($C_{ox}$) on the oxide layer O and the capacitance ($C_{dep}$) corresponding to the depletion area are connected in series, but the capacitance ($C_{ms}$) between the metal layer M and the semiconductor layer becomes lower than the capacitance ($C_{ms}$) in the depletion state by the space charges reduced in number. Therefore, in the weak inversion state, the capacitance ($C_{ms}$) between the metal layer M and the semiconductor layer S may have the minimum value ($C_{min}$).

Next, the strong inversion state is a state in which the magnitude of the voltage applied to the metal layer M is larger than that of the threshold voltage ($V_{TH}$). In the strong inversion state, a large number of electrons in the semiconductor layer S move to the area adjacent to the interface with the oxide layer O, and the electrons corresponding in number to the holes, e.g., the majority carriers are collected at the interface with the oxide layer O, such that a channel may be formed in the semiconductor layer S. In this case, in a case in which a signal applied to the metal layer M is a low-frequency signal, the electrons collected in the depletion area are much larger in number than the space charges, such that the capacitance ($C_{ms}$) between the metal layer M and the semiconductor layer S may have the maximum value ($C_{max}$), like the flat band state. However, in a case in which a signal applied to the metal layer M is a high-frequency signal, the holes, e.g., the majority carriers react well in response to the high-frequency signal, such that the depletion area is formed. However, the electrons, e.g., the minority carriers do not react well. Therefore, the capacitance ($C_{ms}$) between the metal layer M and the semiconductor layer S may have the same minimum value as the capacitance in the weak inversion state.

Next, referring to FIG. 7, the N-type semiconductor layer S has a tendency opposite to the tendency of the P-type semiconductor layer S described with reference to FIGS. 6A to 6E. However, this is resulted from the different types of semiconductor layers S, and the two types of semiconductor layers S may have substantially the same capacitance ($C_{ms}$) between the metal layer M and the semiconductor layer S. However, a section of the N-type semiconductor layer S in which the voltage applied to the signal line is higher than 0 is smaller than that of the P-type semiconductor layer S. Therefore, it may be relatively advantageous to use the P-type semiconductor layer S.

In the display device 100 according to the embodiment of the present disclosure, the semiconductor layer SCL1 is disposed between the substrate 110 and the gate line GL and the sensing line SL, which are the signal lines, and overlaps the gate line GL and the sensing line SL. Therefore, it is possible to reduce parasitic capacitance between the substrate 110 and the signal line. When the substrate 110 is made of transparent conductive oxide or an oxide semiconductor, the parasitic capacitance may occur between the substrate 110 and the signal lines. In particular, a very large amount of parasitic capacitance occurs in the gate line GL and the sensing line SL for transmitting the alternating current voltage, which may cause noise in the signal line. When the parasitic capacitance occurs in the signal line as described above, an RC delay may occur. Therefore, in the display device 100 according to the embodiment of the present disclosure, the semiconductor layer SCL1 disposed between the substrate 110 and the signal line may reduce the parasitic capacitance between the substrate 110 and the signal line. As described above with reference to FIGS. 6A to 7, the parasitic capacitance between the signal line and the substrate 110 may be reduced in the depletion area and the weak inversion area as the voltage is applied to the signal line. In addition, because the high-frequency signal is applied to the gate line GL and the sensing line SL, the parasitic capacitance between the signal line and the substrate 110 may be reduced even in the strong inversion area. Therefore, in the display device 100 according to the embodiment of the present disclosure, the semiconductor layer SCL1 is disposed between the substrate 110 and the signal line for transmitting the alternating current voltage. Therefore, it is possible to reduce the parasitic capacitance occurring in the signal line and reduce or minimize the RC delay caused by noise occurring in the signal line.

Figure 8A:
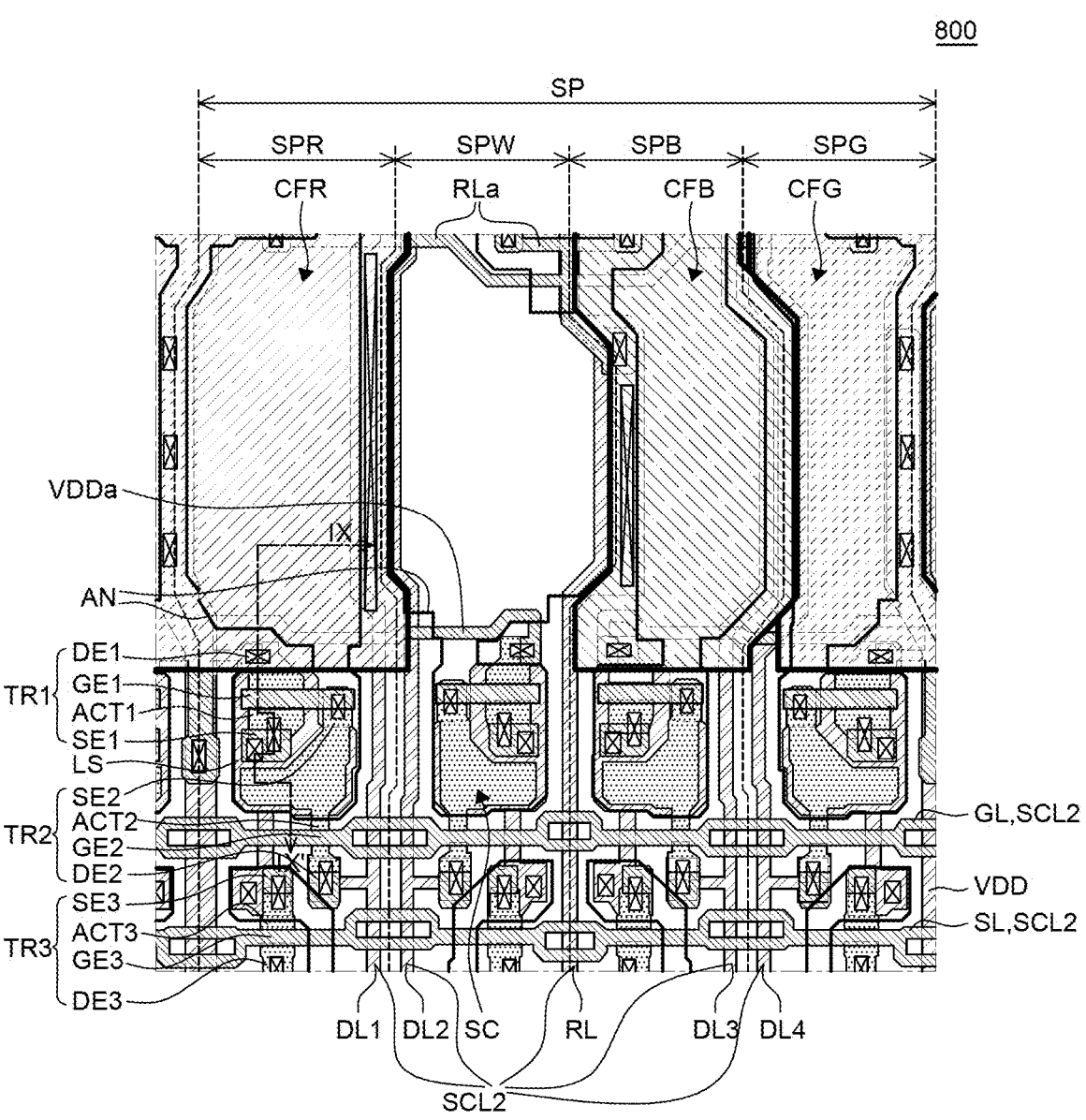
FIG. 8A is an enlarged top plan view of a display device according to another embodiment of the present disclosure.
Figure 8B:
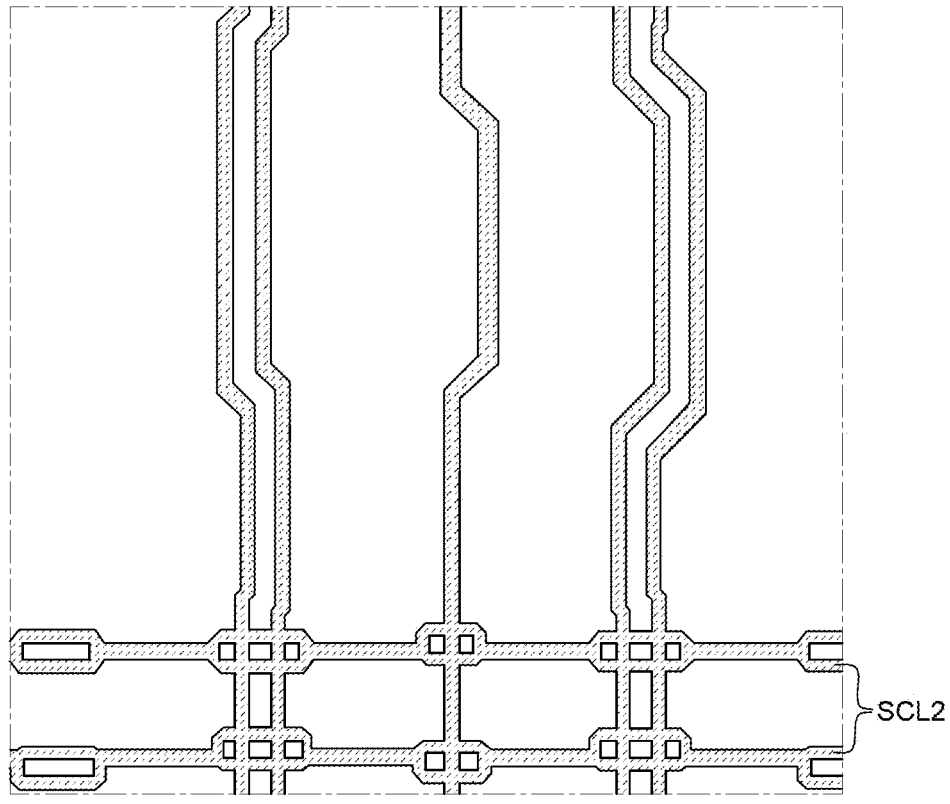
FIG. 8B is an enlarged top plan view of a semiconductor layer of the display device according to another embodiment of the present disclosure.
Figure 9:
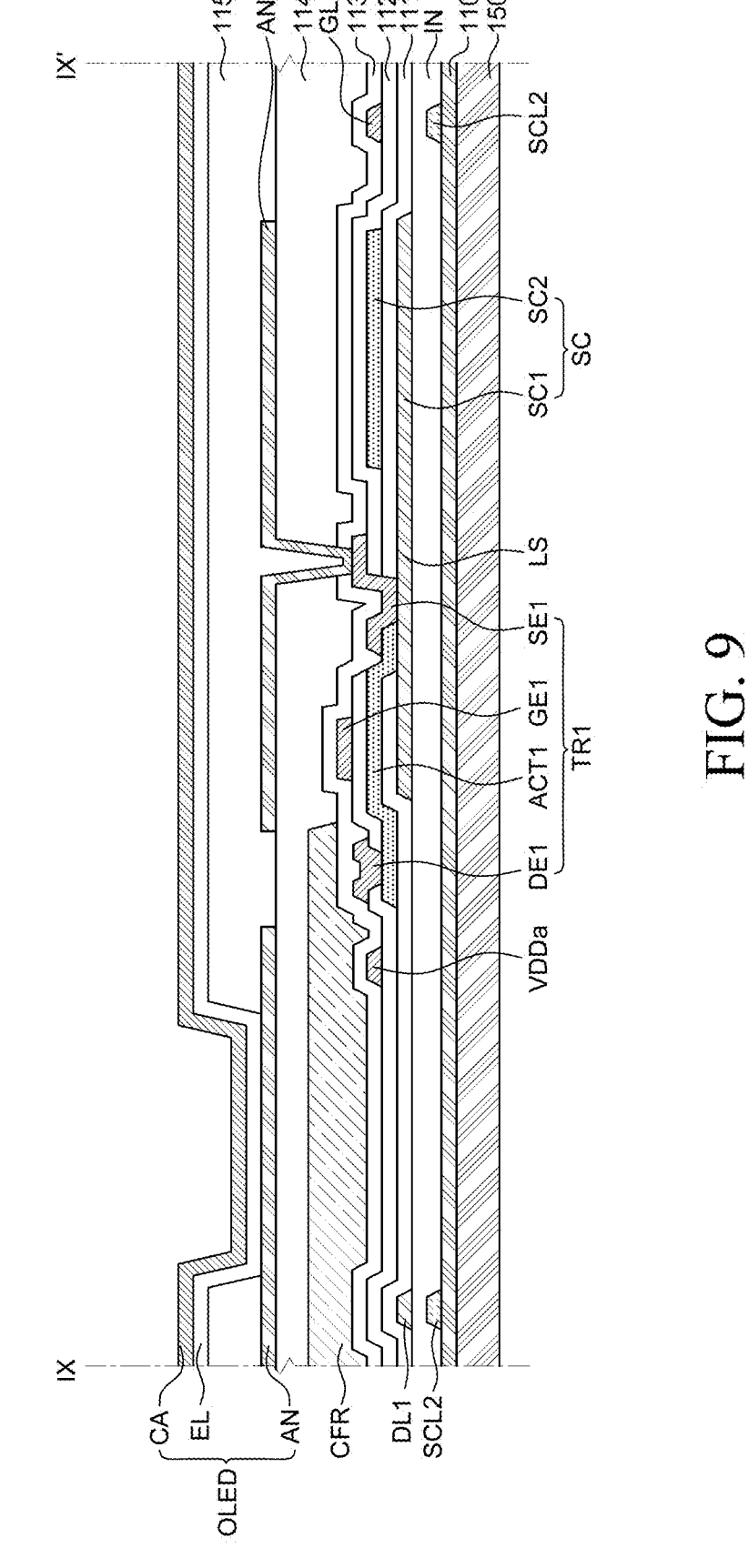
FIG. 9 is a cross-sectional view taken along line IX-IX' in FIG. 8A.

FIG. 8A is an enlarged top plan view of a display device according to another embodiment of the present disclosure. FIG. 8B is an enlarged top plan view of a semiconductor layer of the display device according to another embodiment of the present disclosure. FIG. 9 is a cross-sectional view taken along line IX-IX' in FIG. 8A. A display device 800 illustrated in FIGS. 8A to 9 is substantially identical in configuration to the display device 100 illustrated in FIGS. 1 to 7, except for a semiconductor layer SCL2. Therefore, repeated descriptions of the identical components will be omitted.

Referring to FIGS. 8A to 9, the semiconductor layer SCL2 may be disposed between the substrate 110 and the insulating layer IN. In this case, the semiconductor layer SCL2 may overlap the gate line GL, the sensing line SL, the data line DL, and the reference line RL.

In the display device 800 according to another embodiment of the present disclosure, the semiconductor layer SCL2 is disposed between the substrate 110 and the gate line GL, the sensing line SL, the data line DL, and the reference line RL, which are the signal lines, and overlaps the gate line GL, the sensing line SL, the data line DL, and the reference line RL. Therefore, it is possible to reduce the parasitic capacitance between the substrate 110 and the signal line. When the substrate 110 is made of transparent conductive oxide or an oxide semiconductor, the parasitic capacitance may occur between the substrate 110 and the signal lines. In particular, a very large amount of parasitic capacitance occurs in the gate line GL, the sensing line SL, the data line DL, and the reference line RL that transmit the alternating current voltage, which may cause noise in the signal line. When the parasitic capacitance occurs in the signal line as described above, an RC delay may occur. Therefore, in the display device 800 according to another embodiment of the present disclosure, the semiconductor layer SCL2 disposed between the substrate 110 and the signal line may reduce the parasitic capacitance between the substrate 110 and the signal line. Therefore, in the display device 800 according to another embodiment of the present disclosure, the semiconductor layer SCL2 is disposed between the substrate 110 and the signal lines and overlaps the gate line GL, the sensing line SL, the data line DL, and the reference line RL. Therefore, it is possible to reduce the parasitic capacitance occurring in the signal line and reduce or minimize the RC delay caused by noise occurring in the signal line.

Figure 10A:
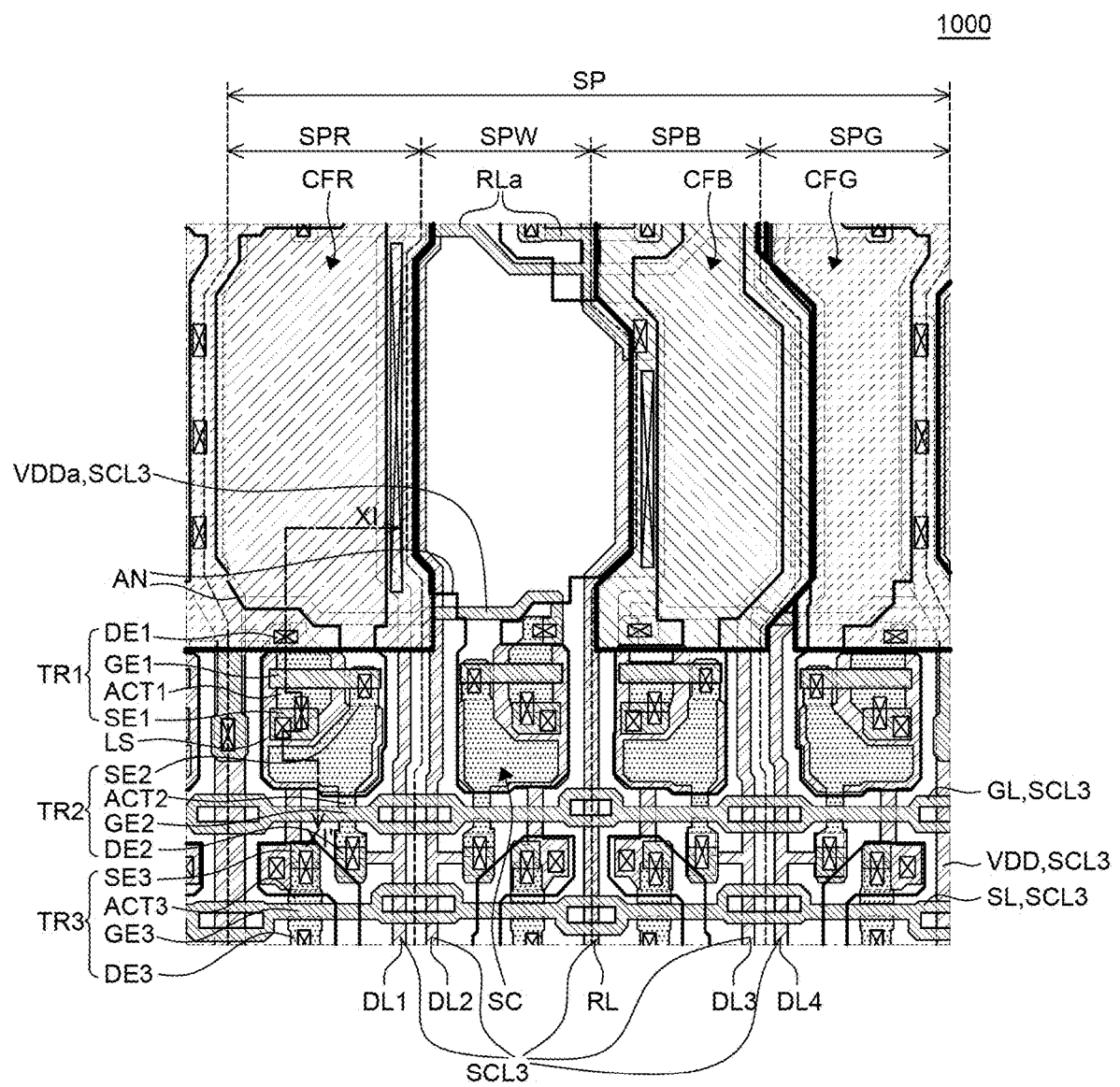
FIG. 10A is an enlarged top plan view of a display device according to still another embodiment of the present disclosure.
Figure 10B:
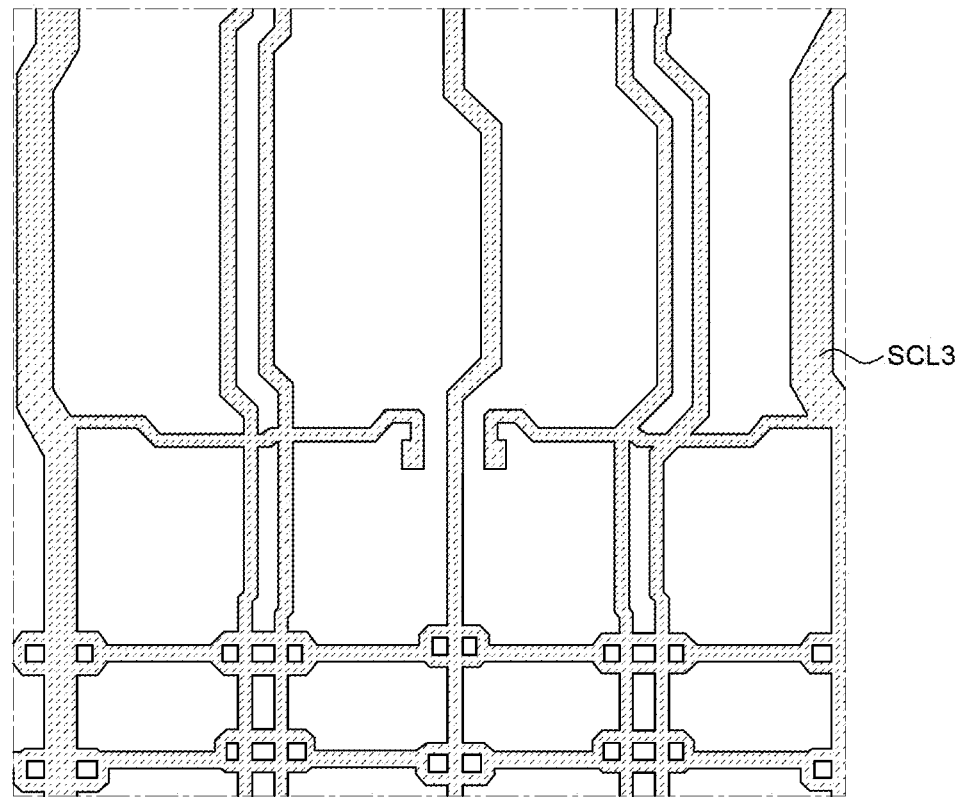
FIG. 10B is an enlarged top plan view of a semiconductor layer of the display device according to still another embodiment of the present disclosure.
Figure 11:
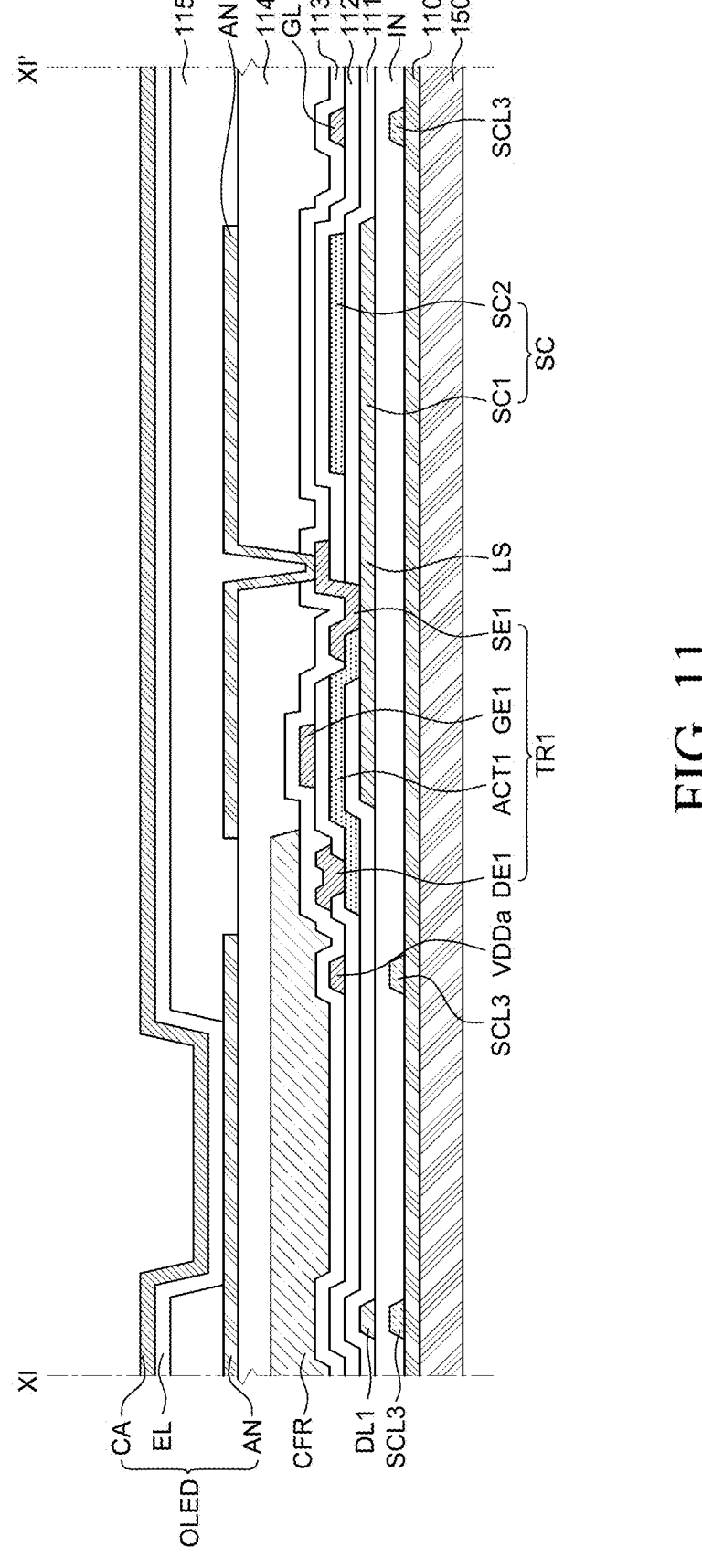
FIG. 11 is a cross-sectional view taken along line XI-XI' in FIG. 10A.

FIG. 10A is an enlarged top plan view of a display device according to still another embodiment of the present disclosure. FIG. 10B is an enlarged top plan view of a semiconductor layer of the display device according to still another embodiment of the present disclosure. FIG. 11 is a cross-sectional view taken along line XI-XI' in FIG. 10A. A display device 1000 illustrated in FIGS. 10A to 11 is substantially identical in configuration to the display device 100 illustrated in FIGS. 1 to 7, except for a semiconductor layer SCL3. Therefore, repeated descriptions of the identical components will be omitted.

Referring to FIGS. 10A to 11, the semiconductor layer SCL3 may be disposed between the substrate 110 and the insulating layer IN. In this case, the semiconductor layer SCL3 may overlap the gate line GL, the sensing line SL, the data line DL, the reference line RL, and the high-potential power line VDD.

In the display device 1000 according to still another embodiment of the present disclosure, the semiconductor layer SCL3 is disposed between the substrate 110 and the gate line GL and the sensing line SL, which are the signal lines, and overlaps the gate line GL, the sensing line SL, the data line DL, the reference line RL, and the high-potential power line VDD. Therefore, it is possible to reduce parasitic capacitance between the substrate 110 and the signal line. When the substrate 110 is made of transparent conductive oxide or an oxide semiconductor, the parasitic capacitance may occur between the substrate 110 and the signal lines. In particular, a very large amount of parasitic capacitance occurs in the gate line GL, the sensing line SL, the data line DL, and the reference line RL, which transmit the alternating current voltage, and in the high-potential power line VDD that transmits the constant voltage, which may cause noise in the signal line. When the parasitic capacitance occurs in the signal line as described above, an RC delay may occur. Therefore, in the display device 1000 according to still another embodiment of the present disclosure, the semiconductor layer SCL3 disposed between the substrate 110 and the signal line may reduce the parasitic capacitance between the substrate 110 and the signal line. Therefore, in the display device 1000 according to still another embodiment of the present disclosure, the semiconductor layer SCL3 is disposed between the substrate 110 and the signal lines and overlaps the gate line GL, the sensing line SL, the data line DL, the reference line RL, and the high-potential power line VDD. Therefore, it is possible to reduce the parasitic capacitance occurring in the signal line and reduce or minimize the RC delay caused by noise occurring in the signal line.

Figure 12A:
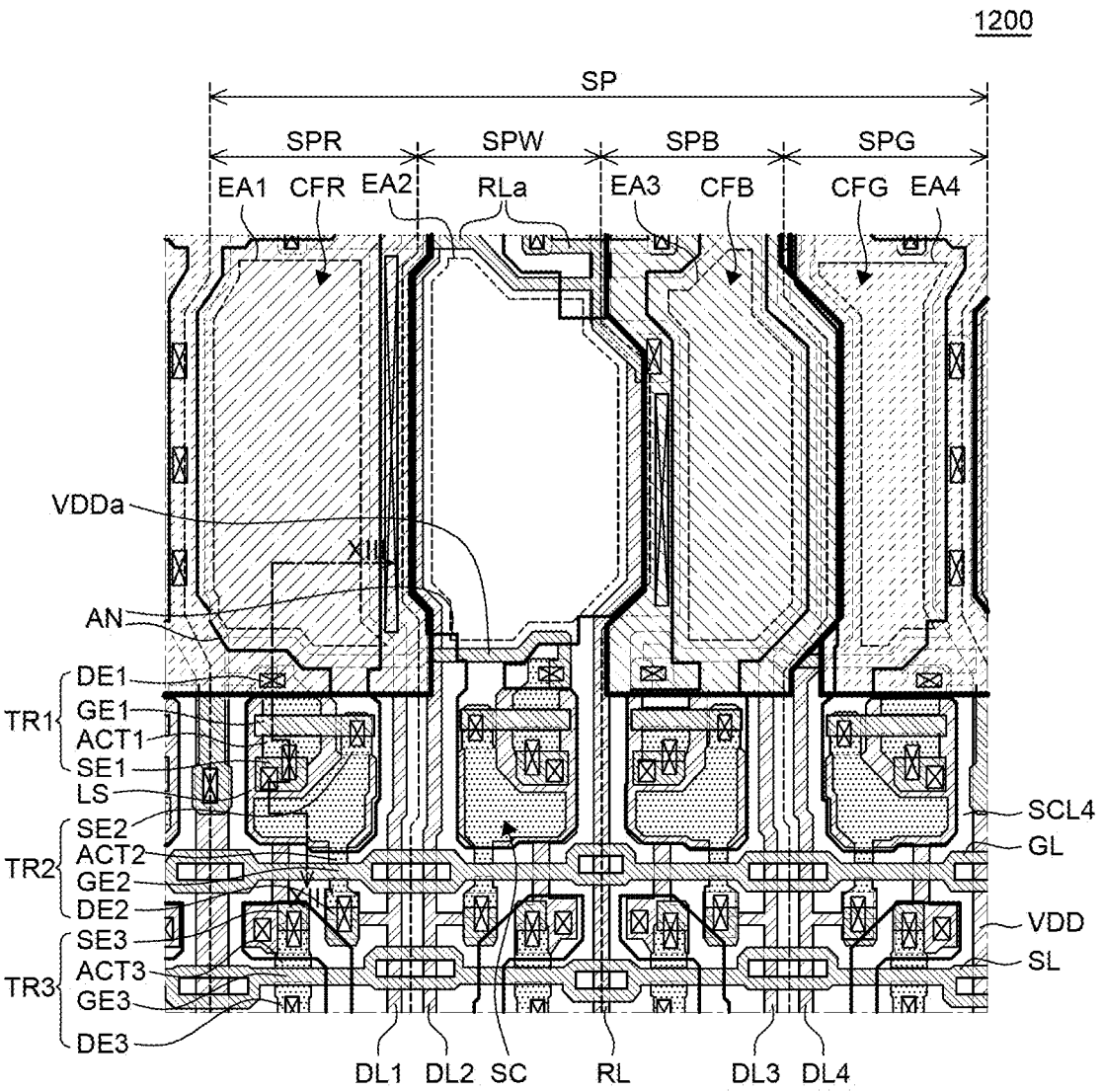
FIG. 12A is an enlarged top plan view of a display device according to yet another embodiment of the present disclosure.
Figure 12B:
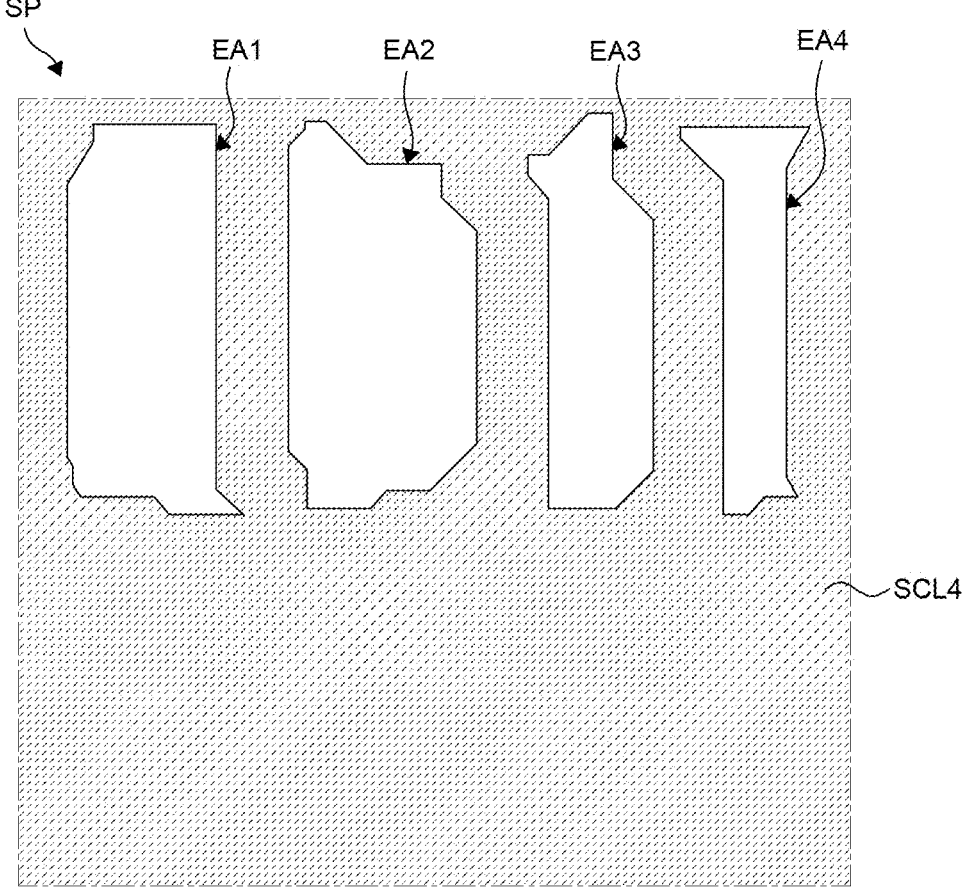
FIG. 12B is an enlarged top plan view of a semiconductor layer of the display device according to yet another embodiment of the present disclosure.
Figure 13:
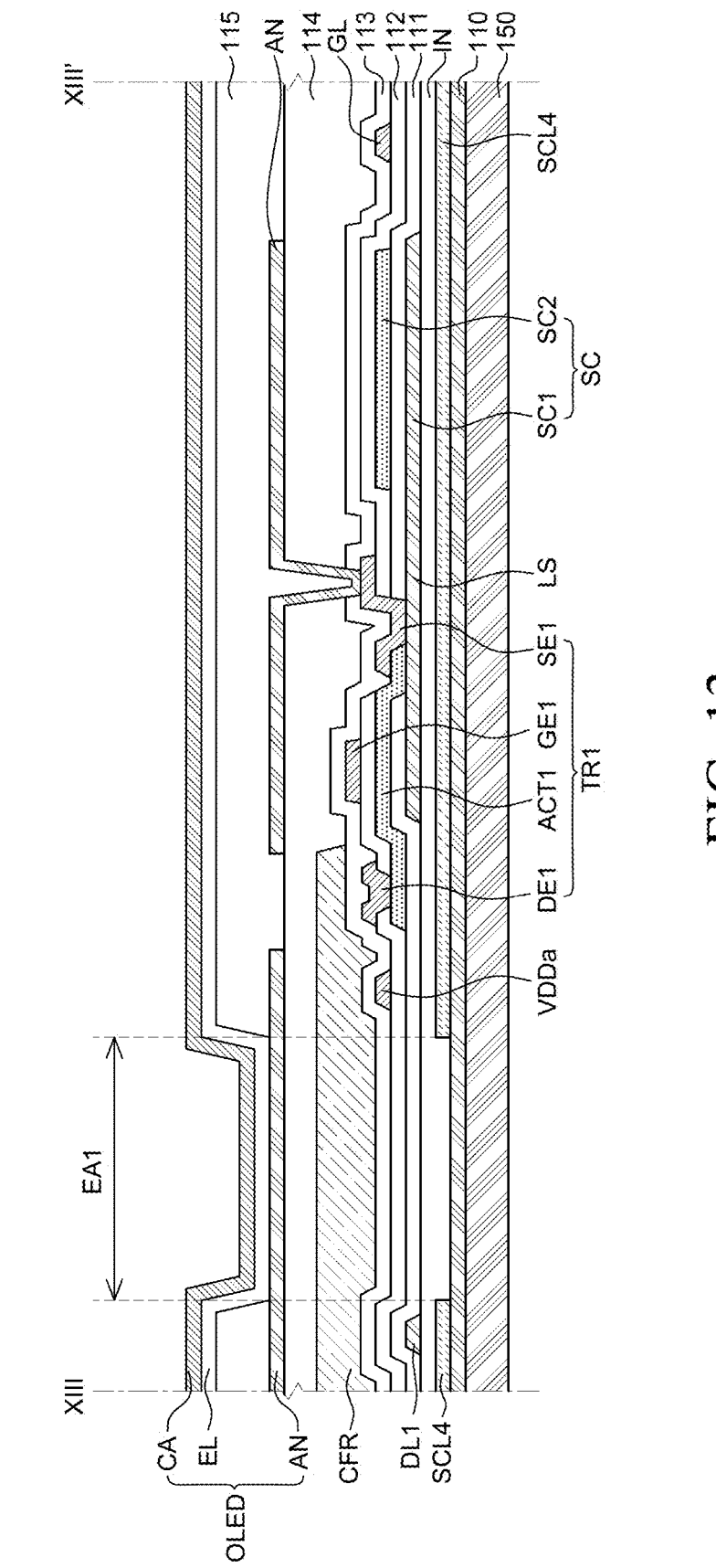
FIG. 13 is a cross-sectional view taken along line XIII-XIII' in FIG. 12A.

FIG. 12A is an enlarged top plan view of a display device according to yet another embodiment of the present disclosure. FIG. 12B is an enlarged top plan view of a semiconductor layer of the display device according to yet another embodiment of the present disclosure. FIG. 13 is a cross-sectional view taken along line XIII-XIII' in FIG. 12A. A display device 1200 illustrated in FIGS. 12A to 13 is substantially identical in configuration to the display device 100 illustrated in FIGS. 1 to 7, except for a semiconductor layer SCL4. Therefore, repeated descriptions of the identical components will be omitted.

Referring to FIGS. 12A and 13 together, the plurality of sub-pixels SP include light-emitting areas EA1, EA2, EA3, and EA4. Each of the light-emitting areas EA1, EA2, EA3, and EA4 are areas that may independently emit light with a single type of color. The light-emitting elements OLED may be disposed in the light-emitting areas EA1, EA2, EA3, and EA4. Specifically, areas, which are exposed from the bank 115 and configured such that the light emitted from the light-emitting elements OLED may propagate to the outside, may be defined as the light-emitting areas EA1, EA2, EA3, and EA4. In this case, the light-emitting areas EA1, EA2, EA3, and EA4 include a first light-emitting area EA1 that is a light-emitting area of the red sub-pixel SPR, a second light-emitting area EA2 that is a light-emitting area of the white sub-pixel SPW, a third light-emitting area EA3 that is a light-emitting area of the blue sub-pixel SPB, and a fourth light-emitting area EA4 that is a light-emitting area of the green sub-pixel SPG.

Referring to FIGS. 12A to 13, the semiconductor layer SCL4 may be disposed between the substrate 110 and the insulating layer IN. In this case, the semiconductor layer SCL4 may be disposed on an area on the substrate 110 excluding the light-emitting areas EA1, EA2, EA3, and EA4. That is, the semiconductor layer SCL4 may overlap an area on the substrate 110 excluding the light-emitting areas EA1, EA2, EA3, and EA4.

In one embodiment, the semiconductor layer SCL4 may be disposed throughout the substrate 110 except for the areas corresponding to the light-emitting areas EA1, EA2, EA3, and EA4.

As illustrated in FIG. 13, the semiconductor layer SCL4 overlaps with the sub-pixel SP except for the light-emitting area (here in FIG. 13, EA1). In one example, the semiconductor layer SCL4 overlaps with an area where the bank 115 is disposed and does not overlap with an area where the bank 115 is not disposed. The area where the bank 115 is not disposed may correspond to the light-emitting area EA1.

In the display device 1200 according to yet another embodiment of the present disclosure, the semiconductor layer SCL4 is disposed between the substrate 110 and the signal line and overlaps the area excluding the light-emitting areas EA1, EA2, EA3, and EA4. Therefore, it is possible to reduce parasitic capacitance between the substrate 110 and the signal lines and between the substrate 110 and the circuit such as the transistor. When the substrate 110 is made of transparent conductive oxide or an oxide semiconductor, the parasitic capacitance may occur between the substrate 110 and the signal lines and between the substrate 110 and the circuit such as the transistor. Therefore, in the display device 1200 according to yet another embodiment of the present disclosure, the semiconductor layer SCL4 disposed between the substrate 110 and the signal lines and between the substrate 110 and the circuit such as the transistor may reduce the parasitic capacitance between the substrate 110 and the signal lines and between the substrate 110 and the circuit such as the transistor.

Figure 14A:
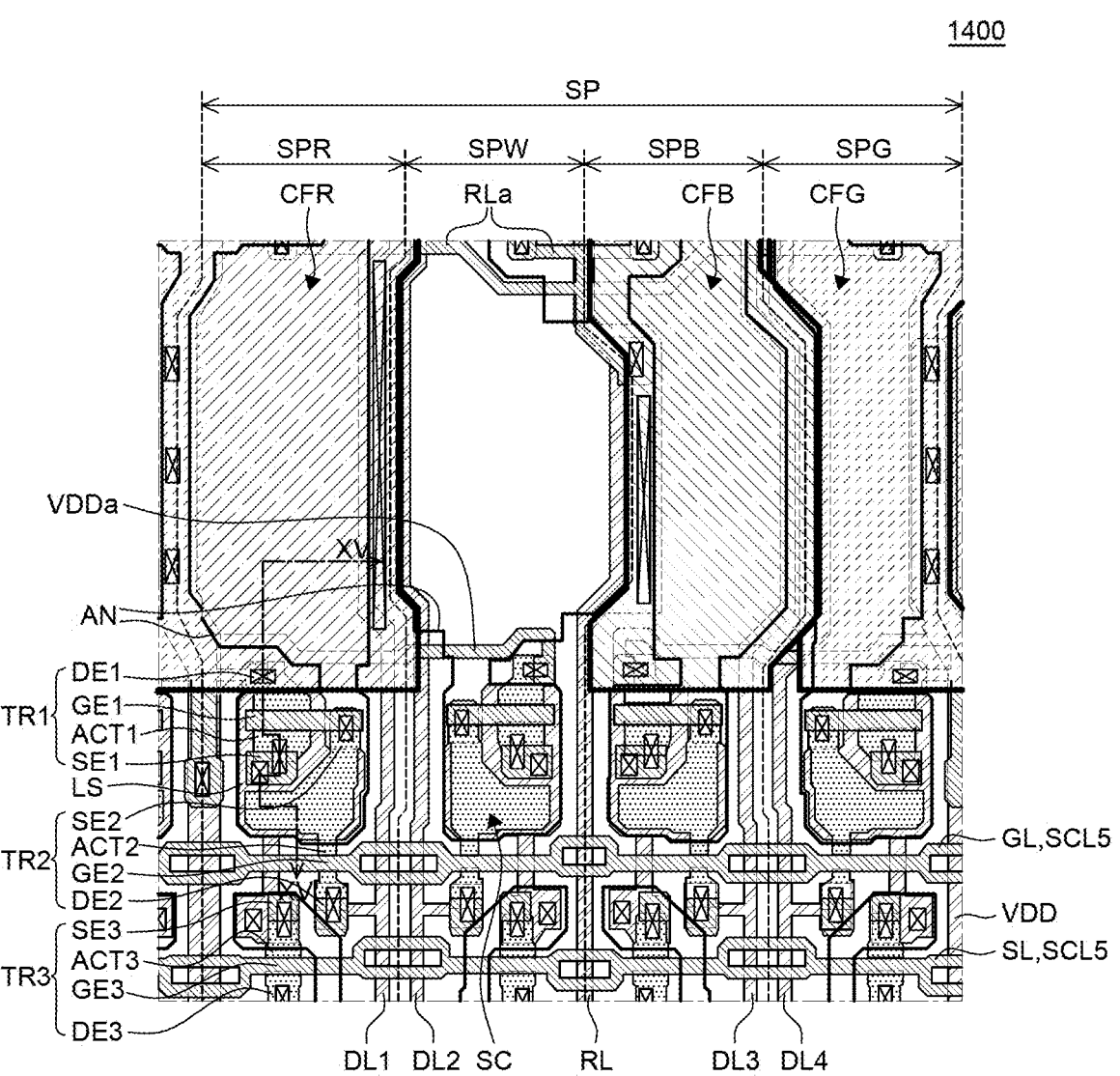
FIG. 14A is an enlarged top plan view of a display device according to still yet another embodiment of the present disclosure.
Figure 14B:
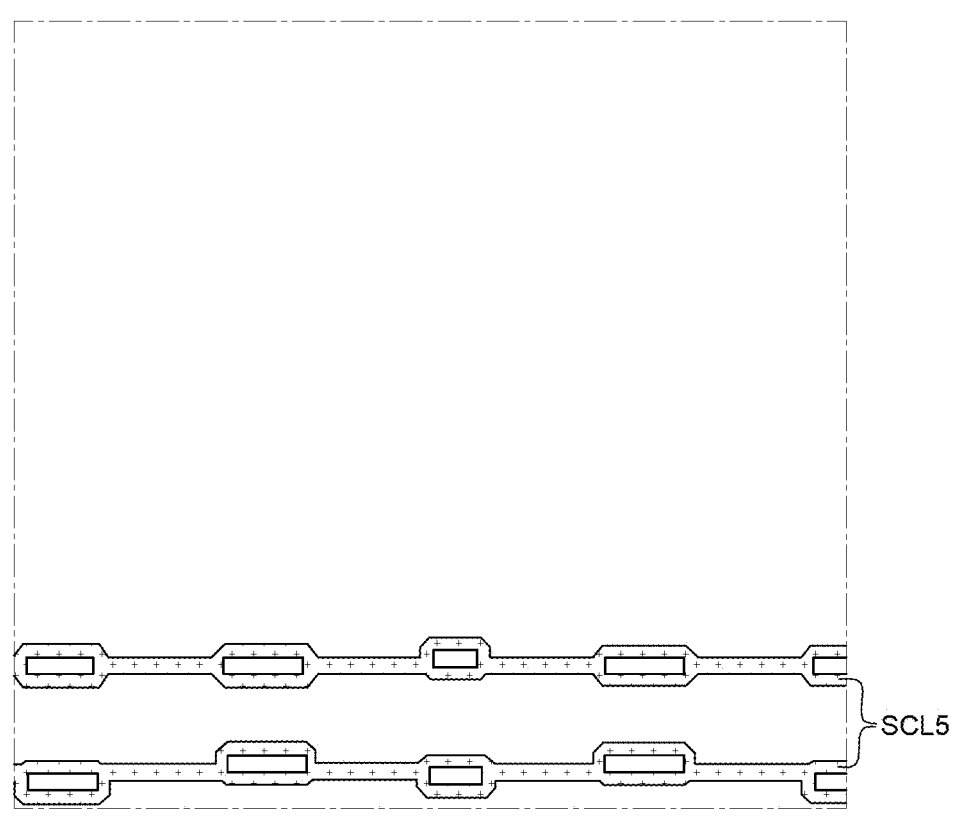
FIG. 14B is an enlarged top plan view of a semiconductor layer of the display device according to still yet another embodiment of the present disclosure.
Figure 15:
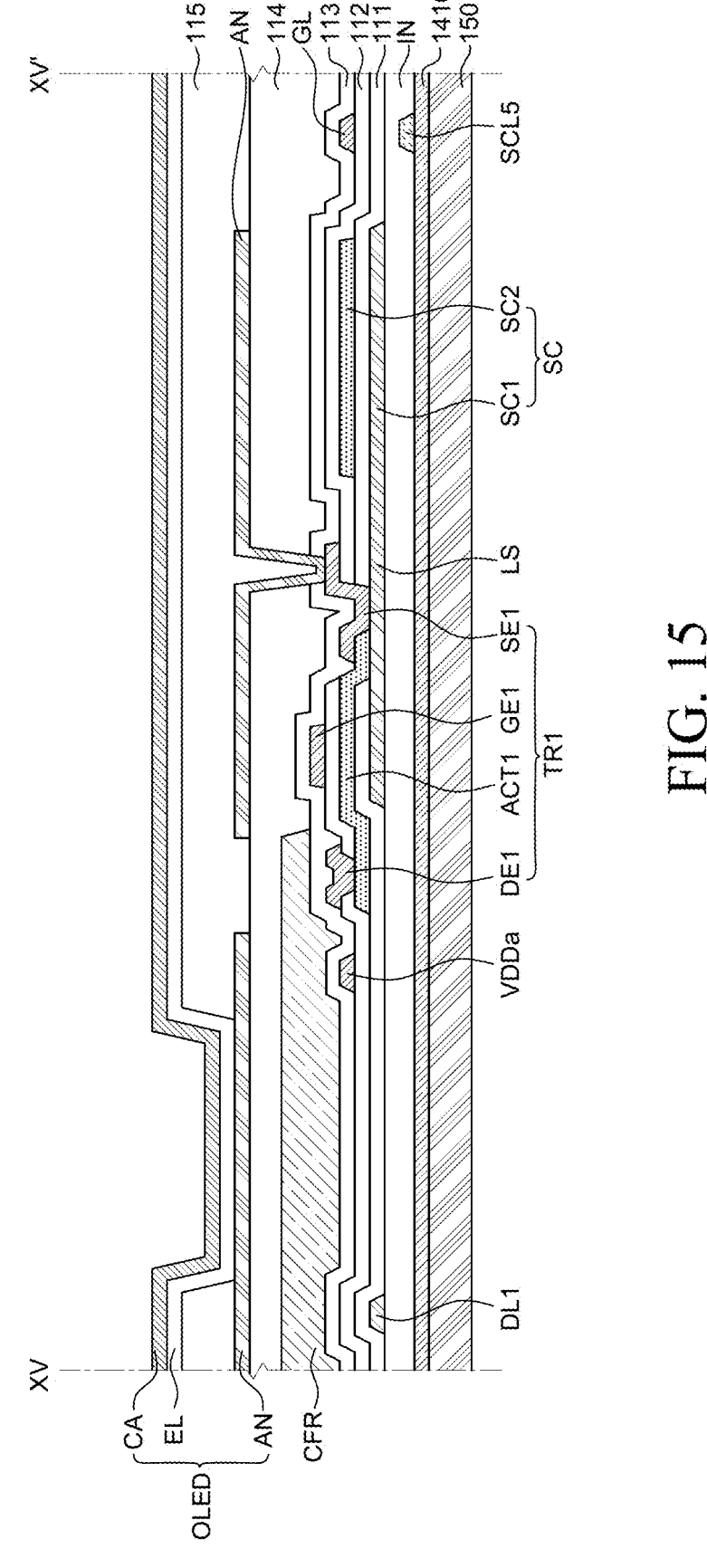
FIG. 15 is a cross-sectional view taken along line XV-XV' in FIG. 14A.

FIG. 14A is an enlarged top plan view of a display device according to still yet another embodiment of the present disclosure. FIG. 14B is an enlarged top plan view of a semiconductor layer of the display device according to still yet another embodiment of the present disclosure. FIG. 15 is a cross-sectional view taken along line XV-XV' in FIG. 14A. A display device 1400 illustrated in FIGS. 14A to 15 is substantially identical in configuration to the display device 100 illustrated in FIGS. 1 to 7, except for a substrate 1410 and a semiconductor layer SCLS. Therefore, repeated descriptions of the identical components will be omitted.

In the display device 1400 according to still yet another embodiment of the present disclosure, the substrate 1410 may be made of a transparent semiconductor material. The substrate 1410 may be made of an oxide semiconductor material containing indium (In) and gallium (Ga), for example, a transparent oxide semiconductor such as indium-gallium-zinc oxide (IGZO), indium gallium oxide (IGO), and indium-tin-zinc oxide (ITZO).

Further, in the case in which the substrate 1410 is made of a transparent semiconductor material, the semiconductor layer SCL5 may be a P-type semiconductor layer. The semiconductor layer SCL5 may be made of any one of an oxide semiconductor, amorphous silicon, and polysilicon.

Referring to FIGS. 14A to 15, in the display device 1400 according to still yet another embodiment of the present disclosure, the semiconductor layer SCL5 is disposed between the substrate 1410 and the gate line GL and the sensing line SL, which are the signal lines, and overlaps the gate line GL and the sensing line SL. Therefore, it is possible to reduce parasitic capacitance between the semiconductor layer SCL5 and the signal line. When the substrate 1410 is made of transparent conductive oxide or an oxide semiconductor, the parasitic capacitance may occur between the substrate 1410 and the signal lines. In particular, a very large amount of parasitic capacitance occurs in the gate line GL and the sensing line SL for transmitting the alternating current voltage, which may cause noise in the signal line. When the parasitic capacitance occurs in the signal line as described above, an RC delay may occur. Therefore, in the display device 1400 according to still yet another embodiment of the present disclosure, the semiconductor layer SCL5 disposed between the substrate 1410 and the signal line may reduce the parasitic capacitance between the substrate 1410 and the signal line. Therefore, in the display device 1400 according to still yet another embodiment of the present disclosure, the semiconductor layer SCL5 is disposed between the substrate 1410 and the signal line. Therefore, it is possible to reduce the parasitic capacitance occurring in the signal line and reduce or minimize the RC delay caused by noise occurring in the signal line.

The example embodiments of the present disclosure can also be described as follows:

According to an aspect of the present disclosure, a display device includes: a substrate including a display area in which a plurality of sub-pixels are disposed, and a non-display area; a plurality of signal lines extending from the display area to the non-display area and configured to transmit an alternating current voltage; and a semiconductor layer disposed between the substrate and the plurality of signal lines and overlapping the plurality of signal lines.

The substrate may be made of transparent conductive oxide.

The semiconductor layer may be made of any one of an oxide semiconductor, amorphous silicon, and polysilicon.

The semiconductor layer may be an N-type semiconductor layer or a P-type semiconductor layer.

The substrate may be made of a transparent semiconductor material.

The semiconductor layer may be made of any one of amorphous silicon and polysilicon.

The semiconductor layer may be a P-type semiconductor layer.

The plurality of signal lines may include a plurality of gate lines.

The plurality of signal lines may include a plurality of data lines and a plurality of reference lines.

The plurality of signal lines may include a plurality of high-potential power lines.

Each of the plurality of sub-pixels may include a light-emitting area, and the semiconductor layer may be disposed on an area excluding the light-emitting area.

The display device may further include a gate drive circuit disposed in the non-display area and connected to the plurality of gate lines. The semiconductor layer may be disposed to overlap a line disposed on the same layer as the plurality of gate lines. The line may be included in the gate drive circuit.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure includes all the technical concepts and its equivalents described within the present disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a substrate body formed as a self-supporting transparent conductive oxide or oxide semiconductor material, the substrate body having thereon a display area in which a plurality of sub-pixels is disposed, and a non-display area;

a plurality of signal lines extending from the display area to the non-display area, the plurality of signal lines configured to transmit alternating current voltage; and a semiconductor layer disposed between the substrate body and the plurality of signal lines and overlapping the plurality of signal lines, the semiconductor layer being configured to reduce parasitic capacitance between the substrate body and the plurality of signal lines.

2. The display device of claim 1, wherein the transparent conductive oxide includes ITO, IZO, or ITZO.

3. The display device of claim 2, wherein the semiconductor layer is made of any one of an oxide semiconductor, amorphous silicon, and polysilicon.

4. The display device of claim 2, wherein the semiconductor layer is either an N-type semiconductor layer or a P-type semiconductor layer.

5. The display device of claim 1, wherein the semiconductor layer is made of any one of amorphous silicon and polysilicon.

6. The display device of claim 1, wherein the semiconductor layer is a P-type semiconductor layer.

7. The display device of claim 1, wherein the plurality of signal lines includes a plurality of gate lines.

8. The display device of claim 7, further comprising:
a gate drive circuit disposed in the non-display area and coupled to the plurality of gate lines,
wherein the semiconductor layer is disposed to overlap a line disposed on a same layer as the plurality of gate lines,
wherein the line is included in the gate drive circuit.

9. The display device of claim 1, wherein the plurality of signal lines includes a plurality of data lines and a plurality of reference lines.

10. The display device of claim 1, wherein the plurality of signal lines includes a plurality of high-potential power lines.

11. The display device of claim 1, wherein each of the plurality of sub-pixels include a light-emitting area, and
wherein the semiconductor layer is disposed on an area excluding the light-emitting area.

12. The display device of claim 1, wherein the substrate body lacks a glass layer or polymer base layer.

13. A display device, comprising:
a substrate body consisting essentially of a transparent conductive oxide material or an oxide semiconductor material;
a semiconductor layer disposed on the substrate body;
an insulating layer disposed on the semiconductor layer;
at least one sub-pixel on the substrate body, the at least one sub-pixel including:
a light-emitting element; and
a transistor coupled to the light-emitting element; and
a plurality of signal lines coupled to the at least one sub-pixel;
wherein the semiconductor layer is disposed between the substrate body and the plurality of signal lines and overlaps the plurality of signal lines, and is configured to reduce parasitic capacitance between the substrate body and the plurality of signal lines.

14. The display device of claim 13, wherein the insulating layer is between the transistor and the substrate body; and the semiconductor is between the insulating layer and the substrate body.

15. The display device of claim 13, wherein the plurality of signal lines include:

a gate line configured to transmit gate voltages to the at least one sub-pixel, wherein the semiconductor layer overlaps the gate line.

16. The display device of claim 13, wherein the plurality of signal lines include:

a data line configured to transmit data voltages to the at least one sub-pixel;

a reference line configured to transmit data-reference voltages to the at least one sub-pixel; and wherein the semiconductor layer overlaps the data line and the reference line.

17. The display device of claim 13, wherein the plurality of signal lines include:

a high-potential power line configured to transmit power supply voltages to the at least one sub-pixel, wherein the semiconductor layer overlaps the high-potential power line.

18. The display device of claim 13, comprising:

a light-emitting area between adjacent bank layers, the light emitting area including the light-emitting element, wherein the semiconductor layer overlaps the at least one sub-pixel except for the light-emitting area.

19. The display device of claim 13, wherein the plurality of signal lines, in operation, transmits an alternating current voltage.

20. The display device of claim 13, wherein the substrate body lacks a glass layer or polymer base layer.

\* \* \* \* \*